United States Patent
Baek et al.

(10) Patent No.: US 7,639,521 B2
(45) Date of Patent: Dec. 29, 2009

(54) RESISTIVE MEMORY CELLS AND DEVICES HAVING ASYMMETRICAL CONTACTS

(75) Inventors: In-Gyu Baek, Seoul (KR); Moon-Sook Lee, Seoul (KR); Dong-Chul Kim, Gyeonggi-do (KR)

(73) Assignee: Samsung Elecctronics Co., Ltd. (KR)

( * ) Notice: Subject to any disclaimer, the term of this patent is extended or adjusted under 35 U.S.C. 154(b) by 293 days.

(21) Appl. No.: 11/378,945

(22) Filed: Mar. 17, 2006

(65) Prior Publication Data

US 2006/0215445 A1 Sep. 28, 2006

(30) Foreign Application Priority Data

Mar. 28, 2005 (KR) .................. 10-2005-0025561

(51) Int. Cl.
*G11C 11/00* (2006.01)
(52) U.S. Cl. .............. 365/148; 365/161; 365/163; 365/171; 365/173
(58) Field of Classification Search ............ 365/158, 365/208, 174, 148, 163, 171, 173
See application file for complete search history.

(56) References Cited

U.S. PATENT DOCUMENTS

| | | | | |
|---|---|---|---|---|
| 6,707,085 B2* | 3/2004 | Jang et al. | ............. | 257/295 |
| 6,831,330 B2 | 12/2004 | Harshfield | | |
| 6,849,891 B1 | 2/2005 | Hsu et al. | | |
| 6,943,395 B2* | 9/2005 | Oh et al. | ............. | 257/295 |
| 6,992,922 B2* | 1/2006 | Rinerson | ............. | 365/158 |
| 2004/0047177 A1* | 3/2004 | Fukuzumi | ............. | 365/157 |
| 2004/0170052 A1* | 9/2004 | Inui | ............. | 365/158 |
| 2005/0048675 A1* | 3/2005 | Ikeda | ............. | 438/3 |
| 2005/0243630 A1 | 11/2005 | Hsu et al. | | |

FOREIGN PATENT DOCUMENTS

| | | |
|---|---|---|
| JP | 2004-311969 | 11/2004 |
| KR | 1020030003020 A | 1/2003 |
| KR | 1020040041015 A | 5/2004 |
| KR | 1020040101037 A | 12/2004 |

OTHER PUBLICATIONS

Notice to File a Response/Amendment to the Examination Report, Korean Application No. 10-2005-0025561, Aug. 22, 2006.

* cited by examiner

*Primary Examiner*—Vu A Le
*Assistant Examiner*—Han Yang
(74) *Attorney, Agent, or Firm*—Myers Bigel Sibley & Sajovec, P.A.

(57) ABSTRACT

A memory cell includes a plug-type first electrode in a substrate, a magneto-resistive memory element disposed on the first electrode, and a second electrode disposed on the magneto-resistive memory element opposite the first electrode. The second electrode has an area of overlap with the magneto-resistive memory element that is greater than an area of overlap of the first electrode and the magneto-resistive memory element. The first surface may, for example, be substantially circular and have a diameter less than a minimum planar dimension (e.g., width) of the second surface. The magneto-resistive memory element may include a colossal magneto-resistive material, such as an insulating material with a perovskite phase and/or a transition metal oxide.

12 Claims, 16 Drawing Sheets

RESISTIVE MEMORY CELLS AND DEVICES HAVING ASYMMETRICAL CONTACTS

CROSS-REFERENCE TO RELATED APPLICATION

This application claims the benefit of Korean Patent Application No. 2005-25561, filed Mar. 28, 2005, the disclosure of which is hereby incorporated herein by reference in its entirety.

BACKGROUND OF THE INVENTION

The present invention relates to memory devices and, more particularly, to magneto-resistive memory devices and methods of fabricating the same.

A resistive memory cell is a nonvolatile memory cell containing a resistive memory element that can reversibly switch between two different resistance states responsive to applied voltage. Colossal magneto-resistive material (CMR) is widely used as a resistive memory element. A resistive memory cell using a CMR element is disclosed in U.S. Pat. No. 6,849,891. The resistive memory cell disclosed in the U.S. Pat. No. 6,849,891 is illustrated in FIG. 1.

Referring to FIG. 1, a conventional magneto-resistive memory cell 18 includes a CMR layer 24, a bottom electrode 20, 22 contacting to a bottom of the CMR layer 24, and a top electrode 26, 28 contacting a top of the CMR layer 24. The bottom electrode and the top electrode may have the same structure and are formed of an oxidation resistance layer 20, 28 and a refractory metal layer 22, 26. The magneto-resistive memory cell 18 is formed by depositing layers 20, 22, 24, 26 and 28 and patterning the deposited layers 20, 22, 24, 26 and 28 using photolithography.

A desirable characteristic for such a cell is a switching operation characteristic that allows clear discrimination between two reversible switching states. The resistive memory cell can provide a reliable memory function when it has two resistance states that may be clearly discriminated from a reference value. If the two resistance states are ambiguous, the resistive memory cell may not function well as a memory cell.

In addition, it is desirable for the resistive memory cell to maintain good switching characteristics after repeated memory operations, i.e., it is desirable that the resistive memory cell maintain a certain value of a low resistance state and a certain value of a high resistance state even after repeated operation. This is related to an endurance of the memory cell.

The structure of the conventional magneto-resistive memory cell 18 shown in FIG. 1 may not provide a good switching operation characteristic. Because the bottom electrode 22, the CMR layer 24 and the top electrode 26 are simultaneously formed, an overlapping area between the CMR layer 24 and the bottom electrode 22 is the same as the area of the CMR layer 24. Accordingly, when a voltage is applied to the two electrodes 22 and 26, the entire CMR layer 24 becomes a switching region in which resistance variation occurs. Because the entire CMR layer 24 serves as the switching region, the position/size/number of filamentary current paths that are switched on and off may not be constant, such that resistance states may not be constant. Consequently, the low resistance state and the high resistance state may be ambiguous.

In addition, it is known that heat resistant metal, which may be used for the bottom electrode 22, may be difficult to etch. For this reason, a side profile of the bottom electrode 22 may be inclined rather than vertical. Accordingly, it may be necessary to increase distance between neighboring resistive memory cells to prevent neighboring cells from electrically shorting. However, this increased distance between neighboring memory cells may serve as an obstacle to the implementation of a highly integrated memory device.

SUMMARY OF THE INVENTION

In some embodiments of the present invention, a memory cell includes a plug-type first electrode in a substrate, a magneto-resistive memory element disposed on the first electrode, and a second electrode disposed on the magneto-resistive memory element opposite the first electrode. The second electrode has an area of overlap with the magneto-resistive memory element that is greater than an area of overlap of the first electrode and the magneto-resistive memory element. The area of overlap of the first electrode may, for example, be substantially circular and have a diameter less than a minimum planar dimension (e.g., width) of the area of overlap of the second electrode. The magneto-resistive memory element may include a colossal magneto-resistive material, such as an insulating material with a perovskite phase and/or a transition metal oxide.

In some embodiments, the first electrode is disposed in an insulating layer and an insulating spacer is disposed between the first electrode and the insulating layer. The first electrode may partially fill a contact hole in the insulating layer, and the magneto-resistive memory element may extend into the contact hole to contact the first electrode.

In additional embodiments of the present invention, a memory device includes a plurality of first electrode lines arranged in parallel on a substrate. A plurality of second electrode lines is arranged in parallel on the substrate transverse to the first electrode lines. A plurality of electrode plugs is electrically coupled to the first electrode lines. Respective ones of the electrode plugs are disposed between ones of the first and second electrode lines at respective intersections thereof. The device further includes a plurality of magneto-resistive memory elements, a respective one of which has a first surface electrically coupled to a respective one of the electrode plugs and a second surface electrically coupled to a second electrode line, wherein the second surface has a greater area than the first surface.

The plurality of magneto-resistive memory elements may include an array of individual patterns disposed between ones of the first and second electrode lines at respective intersections thereof. In some embodiments, the plurality of magneto-resistive memory elements may include a plurality of regions in a magneto-resistive material layer that overlaps multiple ones of the electrode plugs.

In yet further embodiments of the present invention, a memory device includes respective pluralities of parallel electrode lines disposed on a substrate at respective levels, wherein pluralities of electrode lines on adjacent levels extend transverse to one another. The device further includes respective insulating layers between the pluralities of electrode lines of adjacent levels. Respective pluralities of magneto-resistive memory elements are disposed between adjacent ones of the insulating layers and the pluralities of electrode lines. Respective pluralities of electrode plugs penetrate respective ones of the insulating layers at intersections of the electrode lines and couple the electrode lines to the magneto-resistive memory elements. The electrode plugs may have a diameter smaller than a width of the electrode lines. The magneto-resistive memory elements may include layer patterns having substantially the same shape as the electrode lines.

Further embodiments of the present invention provide methods of fabricating a memory cell. An insulating layer is formed on a substrate, and a contact hole is formed in the insulating layer. A first electrode is formed in the contact hole, and a magneto-resistive memory element is formed on the first electrode. A second electrode is formed on the magneto-resistive memory element. An area of overlap of the magneto-resistive memory element and the first electrode may be less than an area of overlap of the magneto-resistive memory element and the second electrode. The magneto-resistive memory element may be patterned simultaneously with the second electrode. In some embodiments, prior to the forming of the first electrode plug, insulating spacers may be formed on sidewalls of the first contact hole. A second insulating layer may be formed on the second electrode and patterned to form a second contact hole exposing a portion of the second electrode. A third electrode may be formed in the second contact hole, and a second magneto-resistive memory element may be formed on the third electrode. A fourth electrode may be formed on the second magneto-resistive memory element.

Some embodiments of the present invention may provide resistive memory cells capable of reducing an overlapping area or contact area between a resistive memory element thin film and an electrode. A resistive memory cell may include a resistive memory element thin film and two electrodes (first electrode and second electrode) connected to both sides of the resistive memory element thin film. One (e.g., the first electrode) of the two electrodes may be configured to be a plug (e.g., first electrode plug) so as to reduce the contact area between the electrode and the resistive memory element thin film, For example, the first electrode may be defined within a contact hole formed in an insulating layer. The first electrode plug can be easily formed using general semiconductor fabricating processes, such as a contact hole process, a conductive material depositing process, an a planarization process.

The overlapping area or contact area between the first electrode plug and the resistive memory element thin film may depend on a diameter of the first electrode plug. In some embodiments, a diameter of the electrode plug is smaller than a minimum width of a bottom electrode of the conventional resistive memory cell of FIG. 1. In addition, an insulating spacer may be further formed within the contact hole after the contact hole process in order to further reduce the diameter of the first electrode plug.

A resistive memory cell according to some embodiments of the present invention may exhibit good switching operation characteristic because the overlapping area between the electrode and the resistive memory element thin film is reduced. In addition, unlike the prior art as shown in FIG. 1, the first electrode plug may be restricted within the contact hole. Therefore, because photolithography for the first electrode may not be required, it may be advantageous to the implementation of highly integrated memory devices.

When a first electrode is defined within the contact hole, the first electrode can fill an entire contact hole or a portion of the contact hole. In the latter case, a portion of the resistive memory element thin film can be positioned within the contact hole. That is, the first electrode can fill a portion of the contact hole and the resistive memory element can fill a remaining portion of the contact hole.

The resistive memory element thin film may include a material that can reversibly switch between at least two resistance states, which are distinctly discriminated by a predetermined voltage applied to both ends of the resistive memory element thin film. For example, the resistive memory element thin film may be formed of material selected from the group consisting of an insulating material with perovskite phase, insulating metal oxide $MO_x$, or a combination thereof. The insulating material with perovskite phase may be an insulating material having a so-called $ABO_3$ structure. Examples of the insulating material with perovskite phase include, but at not limited to, $PbZrTiO_3$, $PrCaMnO_3$, calcium-doped (Ba, Sr) $TiO_3$, $SrZrO_3$, and so on, but are not limited to them. An insulating metal oxide ($MO_x$) may be transition metal oxide or noble metal oxide. Examples of the transition metals include, but are not limited to, nickel (Ni), niobium (Nb), titanium (Ti), zirconium (Zr), hafnium (Hf), cobalt (Co), iron (Fe), copper (Cu), manganese (Mn), and chromium (Cr). A transition metal oxide can also contain impurities, such as lithium, calcium, and lanthanum. The first and second electrodes may be formed from, for example, iridium, platinum, ruthenium, polycrystalline silicon, tungsten (W), titanium nitride (TiN), titanium aluminum nitride (TiAlN), or a combination thereof.

In a resistive memory cell according to some embodiments of the present invention, the resistive memory element thin film reversibly switches between the low resistance state and the high resistance state by the voltage that is appropriately applied to the first electrode and the second electrode. Defects of the resistive memory element thin film may generate impurity states in an energy band gap. Depending on the presence or absence of the impurity states, the resistive memory element thin film may exhibit two distinguishable resistance states. Due to the impurity states, a filamentary current path of a low resistance may be formed, or a filamentary current path already formed may disappear, depending on the applied voltage. For example, metal or oxygen vacancies may generate density of states near the valance or conduction band respectively, while metal defects may do the same just above the electrode Fermi level.

When a metallic defect state is generated above the Fermi level of the resistive memory element thin film, the resistive memory cell may take on a low resistance state (e.g., a set state). On the contrary, when the metallic defect state disappears, the resistive memory cell may take on a high resistance state (e.g., a reset state). For a switching between the set state and the reset state, different voltages may be applied to two electrodes of the resistive memory cell. A reset voltage for the reset state may be lower than a set voltage for the set state. For example, the set voltage may be 1.5-2.5 times the reset voltage.

In order to make a resistive memory element thin film transition to the set state, a first voltage can be applied for about 1-100 ns, preferably about 1-10 ns. Meanwhile, in order to make a resistive memory element thin film transition to the reset state, a second voltage can be applied for about 1-100 µs, preferably about 1-10 µs. Under the condition that the set voltage is higher than the reset voltage, the set voltage may be 0.15-7.5 V and the reset voltage may be 0.1-3 V. In some embodiments, the set voltage may be 1-2 V and the reset voltage may be 0.4-0.8 V. The set voltage and the reset voltage may depend on thickness of the resistive memory element thin film.

Assuming that a reset current is a current flow when changing from the set state to the reset state, and a set current is a current flow when changing from the reset state to the set state, the reset current may be greater than the set current. Accordingly, by applying an appropriate voltage or current regardless of polarity, the resistive memory cell may be programmed to the set state or the reset state, regardless of the previous states of the resistive memory cell. In order to read the data from the resistive memory cell, a voltage at which the resistive memory cell is not reset, that is, a voltage lower than the reset voltage, may be applied.

An initial set voltage just after the resistive memory element thin film is initially formed, that is, a forming voltage, is somewhat associated with thickness of the resistive memory element thin film formed of the transition metal oxide. As the resistive memory element thin film is thinner, the forming voltage may be decreased. Accordingly, it may be desirable that the resistive memory element thin film be thinner for low voltage operation.

The set voltage and the reset voltage may be influenced by oxygen content of a resistive memory element thin film formed of the transition metal oxide. Accordingly, it may be desirable that a resistive memory element formed of the transition metal oxide have a certain oxygen content.

For a resistive memory cell operating at the low voltage or current, the composition of the transition metal oxide may be controlled. It may be desirable that oxygen composition ratio of the transition metal oxide is smaller than oxygen composition ratio of the stable state. In other words, it may be desirable that the transition metal oxide has a relatively large transition metal content compared with its stable state. For example, in transition metal oxide expressed as $MO_x$, when the metal "M" is nickel (Ni), cobalt (Co), Zinc (Zn), or copper (Cu), "x" representing the composition ratio of oxygen atoms has the range from 0.5 to 0.99 ($0.5 \leq x \leq 0.99$). On the contrary, when the metal "M" is hafnium (Hf), zirconium (Zr), titanium (Ti), or chromium (Cr), "x" representing the composition ratio of oxygen atoms has the range from 1.0 to 1.98 ($1.0 \leq x \leq 1.98$). When the metal "M" is iron (Fe), "x" representing the composition ratio of oxygen atoms has the range from 0.75 to 1.485. Also, when the metal "M" is niobium (Nb), "x" representing the composition ratio of oxygen atoms has the range from 1.25 to 2.475.

Using various techniques, a transition metal oxide can be formed to have the above composition ratio of oxygen atoms. For example, the transition metal oxide can be formed by alternately and repeatedly performing an operation of forming a transition metal layer and an operation of oxidizing the transition metal layer using an oxygen plasma treatment. The transition metal layer can be formed using a sputtering technique. Also, the oxygen plasma treatment can be performed in-situ. In some embodiments, the transition metal oxide layer can be formed using $O_2$ reactive sputtering technique, a chemical vapor deposition (CVD) technique, or an atomic layer deposition (ALD) technique.

Some embodiments of the present invention provide methods of fabricating a resistive memory cell capable of reducing the overlapping area between the resistive memory element thin film and the electrode. In some embodiments, a first electrode plug is formed within an insulating layer, and a resistive memory element thin film and a conductive layer for a second electrode is formed. The forming of the first electrode plug may include patterning the insulating layer to form a contact hole, and filling the contact hole with a conductive material. The filling of the contact hole with the conductive material can be achieved by depositing and planarizing the conductive material. Examples of the planarization process are a chemical mechanical polishing (CMP) and an etch-back process.

The resistive memory element thin film need not be separated between adjacent cells. For electrical separation of the second electrode between adjacent cells, a conductive layer for the second electrode may be patterned by photolithography. Unlike the prior art as shown in FIG. 1, the first electrode plug acting as the bottom electrode need not undergo photolithography, so that thickness of the patterned layer may be less than that of the prior art as shown in FIG. 1. Consequently, highly integrated resistive memory devices can be implemented.

Some embodiments of the present invention provide resistive memory arrays. The resistive memory array may include: a plurality of first electrode lines arranged in parallel from one another; a plurality of second electrode lines intersecting the first electrode lines and arranged in parallel from one another; a plurality of resistive memory element patterns positioned on a first surface of the first electrode lines or a second surface of the second electrode lines, the first surface and the second surface being faced each other; and a plurality of third electrode plugs positioned at intersections of the first electrode lines and the second electrode lines and connecting the resistive memory element pattern to one of the first electrode lines and the second electrode lines.

Further embodiments of the present invention may provide stacked resistive memory arrays including: a plurality level of electrode lines configured to be insulated from adjacent levels of electrode lines by an insulating layer; a plurality of resistive memory element patterns disposed between the insulating layer and the respective level of electrode lines; and a plurality of electrode plugs passing through the insulating layer corresponding to intersecting points of adjacent levels of the electrode lines, and connecting respective electrode line and the resistive memory element pattern.

BRIEF DESCRIPTION OF THE DRAWINGS

The accompanying drawings are included to provide a further understanding of the invention and are incorporated in and constitute a part of this application illustrate embodiment(s) of the invention. In the drawings.

DETAILED DESCRIPTION OF THE INVENTION

Figure 1:
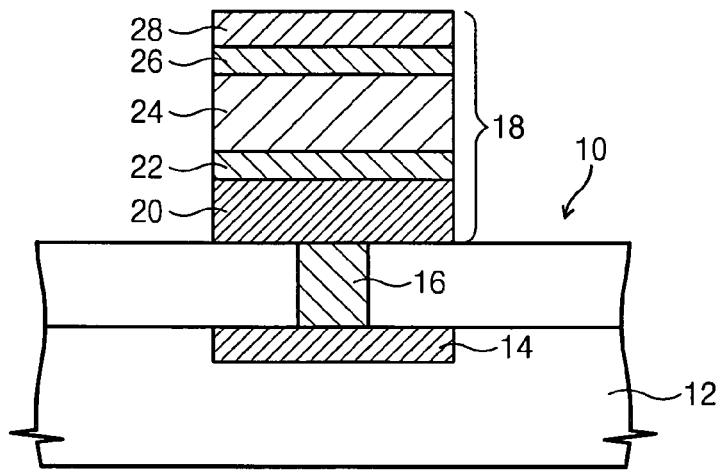
FIG. 1 is a sectional view of a conventional resistive memory cell.

The present invention will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the Figures. For example, if the device in the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature, although other materials may be used.

Operation Characteristic of a Magneto-Resistive Memory Cell

Operation characteristics of magneto-resistive (hereinafter referred to as "resistive" or "magneto-resistive") memory cells will be first described. A resistive memory cell may include a resistive memory element thin film disposed between two electrodes. It will be assumed for the purpose of illustration that that two electrodes are formed of iridium and the resistive memory element thin film is formed of nickel oxide layer that is a transition metal oxide.

When an asymmetric voltage is applied between two electrodes of the resistive memory cell, a filamentary current path may be formed, or a filamentary current path already formed may disappear. It is presumed, for the purposes of the following theoretical analysis, that the filamentary current path is associated with defects in the resistive memory element thin film.

Figure 2A:
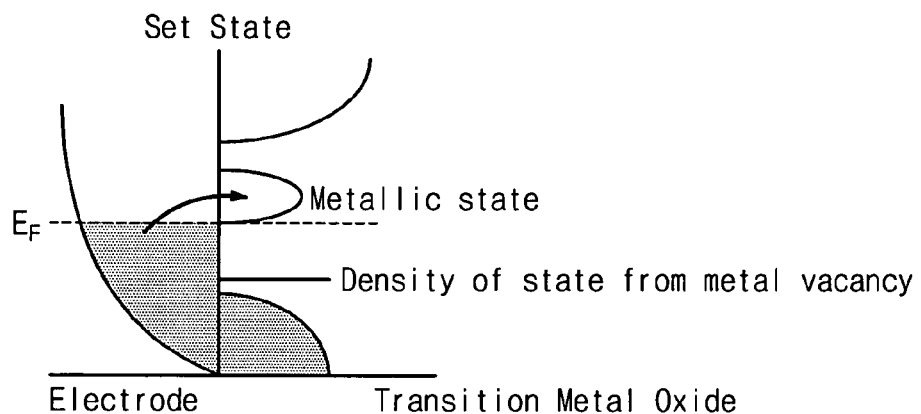
FIG. 2A is an energy diagram of a metal and a transition metal oxide in a set state and a reset state of a resistive memory cell according to some embodiments of the present invention.

The defects of the resistive memory element thin film generate an impurity state in an energy band gap. For example, as illustrated in FIG. 2A, metal or oxygen vacancies generate a density of state near the valence band or conduction band, while metallic states do the same just above the electrode Fermi level.

When the metallic state is generated above the Fermi level of the resistive memory element thin film, the resistive memory cell has a low resistance state (e.g., a set state). On the contrary, when the metallic state disappears, the resistive memory cell becomes a high resistance state (e.g., a reset state). To switch between the set state and the reset state, different voltages are applied to the two electrodes of the resistive memory cell. A reset voltage for the reset state is lower than a set voltage for the set state. For example, the set voltage may be 1.5-2.5 times the reset voltage.

Figure 2A:
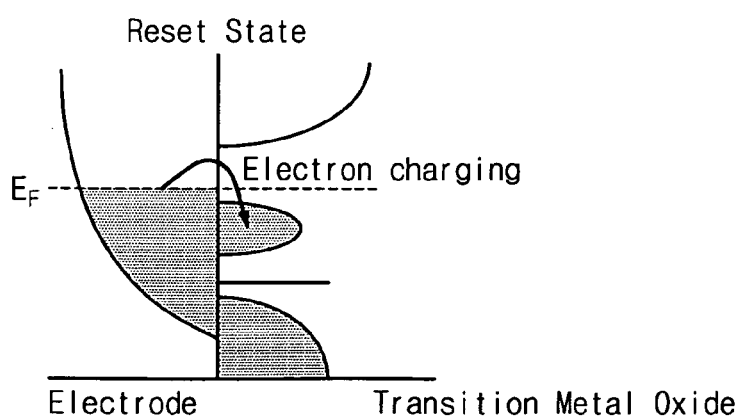
Figure 2B:
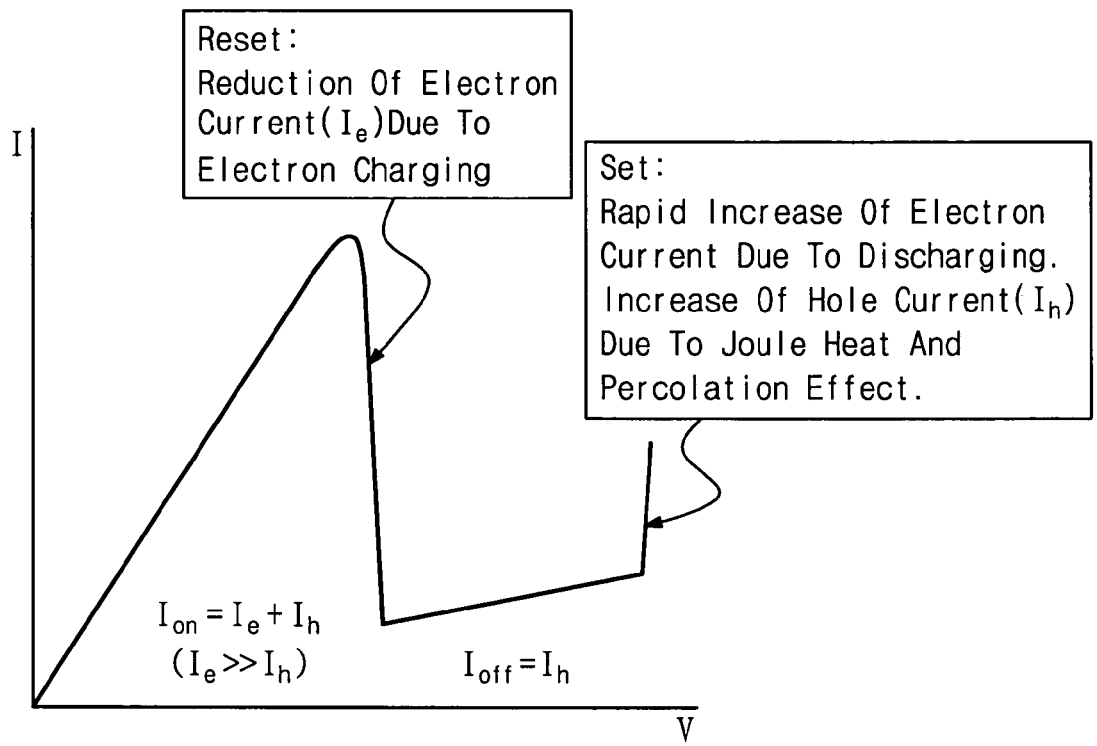
FIG. 2B is a current-voltage curve illustrating a switching mechanism between a set state and a reset state of a resistive memory cell according to some embodiments of the present invention.

As illustrated in FIG. 2B, when switching from the high resistance state to the low resistance state or vice versa, a clockwise or counterclockwise I-V loop (current-voltage loop) is generated. A current (a set current) flow due to a voltage applied in the low resistance state (the set state) decreases. It is because a vacant metallic state is filled with injected charges by an increased bias voltage and thus the vacant metallic state above the Fermi level gradually disappears in the metallic filament. On the contrary, a current (a reset current) flow due to a voltage applied in the high resistance state (the reset state) increases. It is because a metallic state increases due to discharge of previously stored charges in the metallic detect state and a conductivity also increases in a vacant metallic state due to a heating and percolation effect.

The switching between the set state and the reset state may take place independent of polarity of an applied voltage. Because the set voltage is higher than the reset voltage and the reset current is higher than the set current, the resistive memory element thin film can be programmed into either the set state or the reset state from any previous state by choosing proper pulse voltage and current, for example, by applying a voltage lower than the reset voltage. Cell resistance can be read using voltage pulse less than the reset voltage without affecting the stored data.

Figure 3:
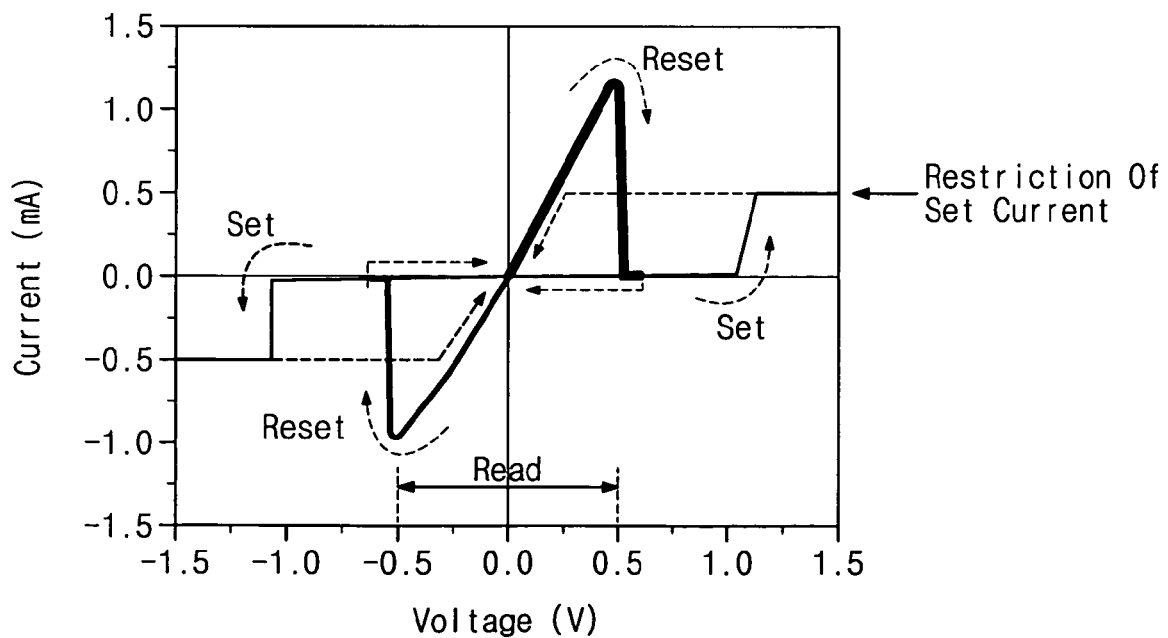
FIG. 3 is a current-voltage curve of a resistive memory cell in a voltage-switching mode according to further embodiments of the present invention.

FIG. 3 is an I-V curve illustrating a switching characteristic of a resistive memory cell having a resistive memory element thin film formed of a nickel oxide layer according to some embodiments of the present invention. In FIG. 3, a horizontal axis represents a voltage (V) applied between a first electrode and a second electrode, and a vertical axis represents a current (mA) flowing through the nickel oxide layer.

The two electrodes of the resistive memory cell are formed of an iridium layer having a thickness of 500 Å. The nickel oxide layer has a thickness of 200 Å. In addition, the nickel oxide layer is formed by alternately and repeatedly performing a first operation of forming a nickel layer having a thickness of 10 Å using a sputtering technique and a second operation of oxidizing the nickel layer using an oxygen plasma treatment. The second operation, that is, the oxygen plasma treatment, is performed for 30 seconds using oxygen gas injected under the conditions of a radio frequency power of 20 W and a flow rate of 2 sccm (standard cubic centimeter per minute). The resistive memory cell has a $0.3 \times 0.7 \, \mu m^2$ rectangular shape.

Referring to FIG. 3, when a voltage of about 0.5 V is applied between the two electrodes, the nickel oxide layer is switched to the high resistance state, that is, the reset state. When a voltage of about 1.1 V is applied between the two electrodes, the nickel oxide layer is switched to the low resistance state, that is, the set state. A current of about 0.5 mA is applied, while a voltage of more than 1.0 V is applied between the two electrodes to change the nickel oxide layer to the set state. The current is controlled to prevent the nickel oxide layer from being damaged when a large current flows through the nickel oxide layer of the set state. As illustrated in FIG. 3, the I-V curve for a nickel oxide layer according to some embodiments of the present invention is symmetrical with respect to a starting point of a voltage of 0.0 V and a current of 0.0 mA.

The resistive memory cell operations described above with reference to FIGS. 2 and 3 may be similarly applied to various resistive memory cells, which will be described later.

Structure and Formation of a Magneto-Resistive Memory Cell

Figure 4A:
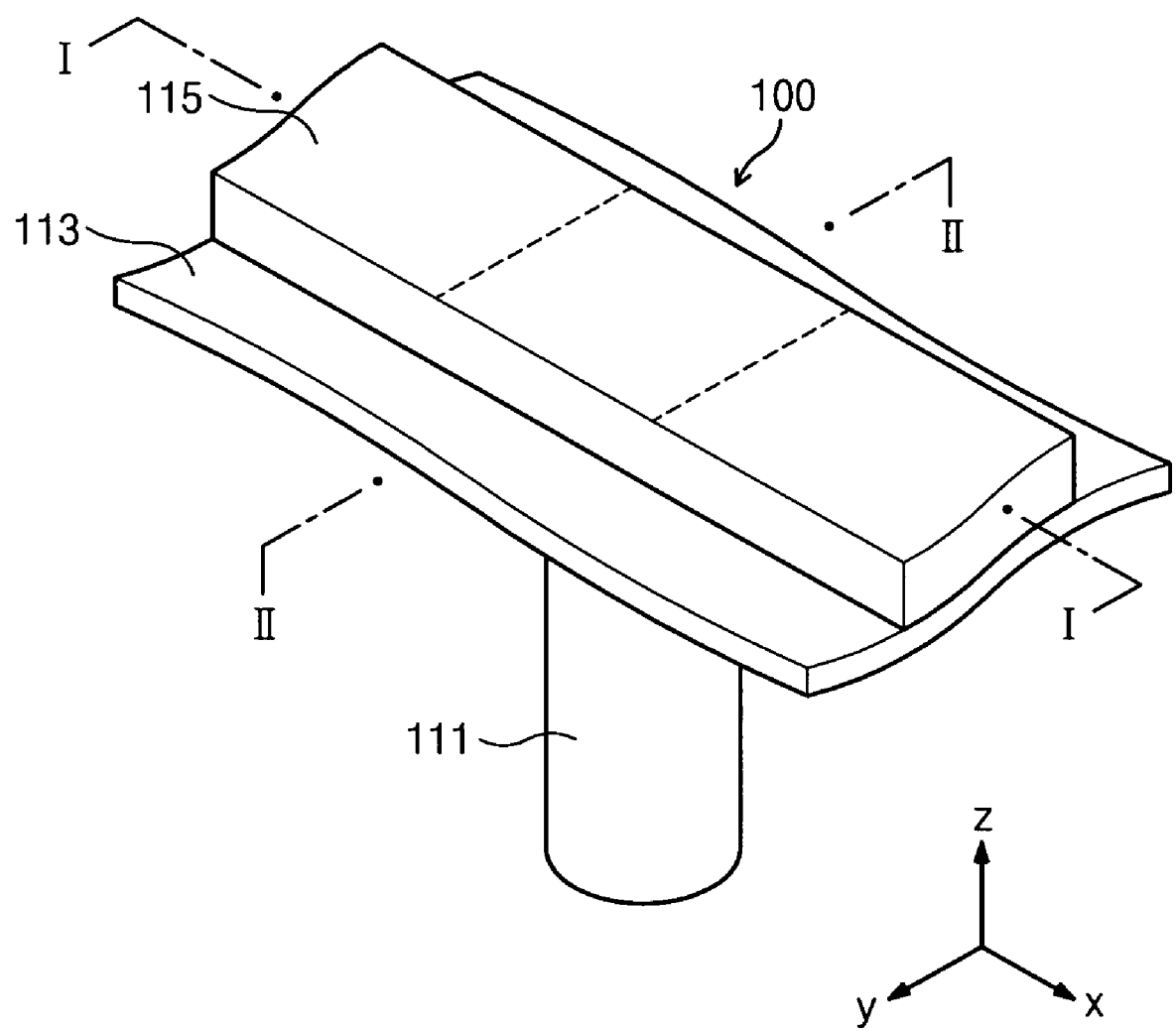
FIG. 4A is a schematic perspective view of a resistive memory cell according to additional embodiments of the present invention.
Figure 4B:
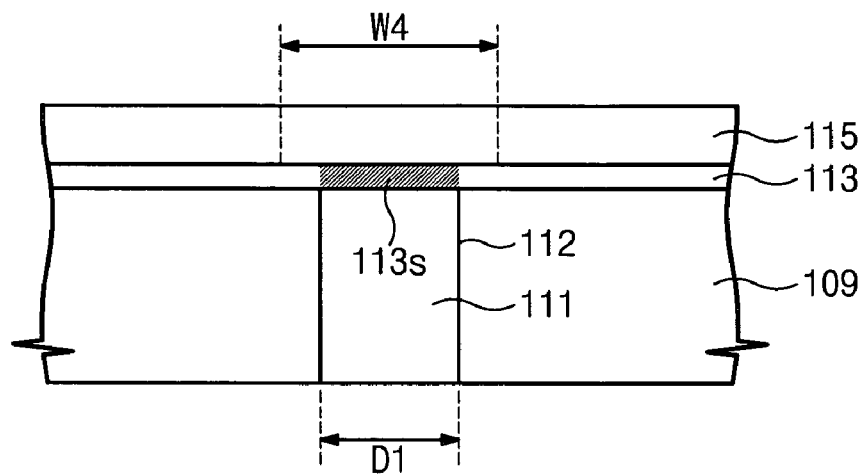
FIGS. 4B and 4C are schematic sectional views taken along lines I-I and II-II in FIG. 4A, respectively.

FIG. 4A is a schematic perspective view of a magneto-resistive memory cell 100 according to some embodiments of the present invention. FIG. 4B is a schematic sectional view taken along line I-I in FIG. 4A, and FIG. 4C is a schematic sectional view taken along line II-II in FIG. 4A.

Referring to FIG. 4A, the resistive memory cell 100 includes a first electrode 111, a resistive memory element thin film 113, and a second electrode 115. The first electrode 111 has a plug shape and extends in a vertical direction (z-axis). The resistive memory element thin film 113 and the second electrode 115 are horizontally disposed on the first electrode 111. The second electrode 115 extends along an x-axis, i.e., the second electrode 115 exhibits a linear shape. Along a y-axis, a minimum width of the second electrode 115 is greater than a width (diameter) of the first electrode 111. This will be apparent from reference to FIGS. 4B and 4C.

Figure 4C:
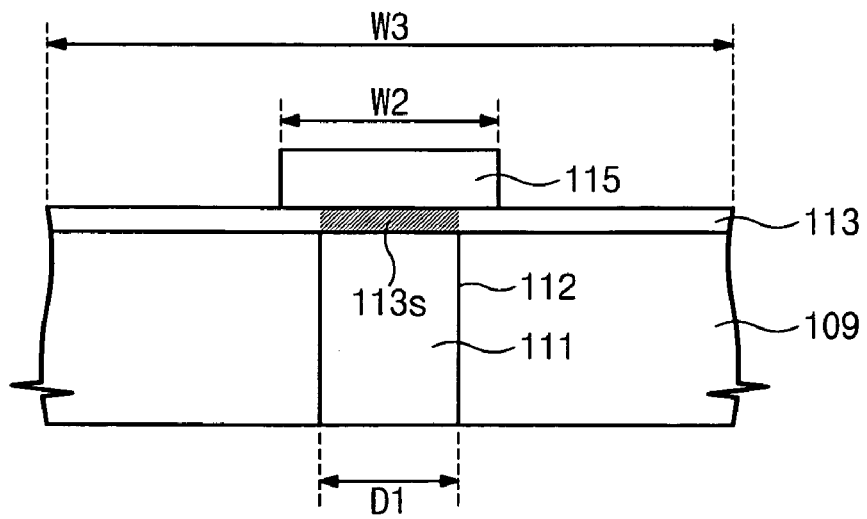

Referring to FIGS. 4B and 4C, the first electrode 111 has a plug shape. The first electrode 111 fills a contact hole 112 that is formed within an insulating layer 109. The resistive memory element thin film 113 is disposed on the first electrode 111 and the insulating layer 109, and the second electrode 115 is disposed on the resistive memory element thin film 113. Along the y-axis, a minimum width W2 of the second electrode 115 is greater than a width (diameter) D1 of the first electrode 111.

Although FIGS. 4B and 4C show that a width W3 of the resistive memory element thin film 113 (along the y-axis) is greater than the minimum width W2 of the second electrode 115, in some embodiments, the width W3 may be identical to the minimum width W2. As indicated by a dotted line in FIGS. 4A and 4B, along the x-axis, the second electrode 115 may have a minimum width W4. The second electrode 115 has a rectangular shape with the width W4 along the x-axis and the width W2 along the y-axis. In the illustrated embodiments, because the minimum width W2 of the second electrode 115 is greater than the diameter D1 of the first electrode 111, an overlapping area between the first electrode 111 and the resistive memory element thin film 113 is smaller than an overlapping area between the second electrode 115 and the resistive memory element thin film 113. The second electrode 115 can have any of a variety of shapes, and the resistive memory element thin film 113 and the second electrode 115 can have the same shape.

In the specification, when relatively comparing the widths of the first electrode, the second electrode, and the resistive memory element thin film, the respective widths are measured in a same direction. In the above embodiment, the width D1 of the first electrode 111, the width W2 of the second electrode 115, and the width W3 of the resistive memory element thin film 113 are all measured in y-direction.

According to some embodiments of the present invention, because one (e.g., the first electrode 111) of the two electrodes has a plug shape, the overlapping area between the first electrode plug 111 and the resistive memory element thin film 113 can be smaller than the overlapping area between the bottom electrode 22 and the CMR layer 24 of FIG. 1. That is, a switching region 113s where the resistance changes in operation is reduced much more than the conventional switching region of FIG. 1. This switching region in the resistive memory element thin film 113 is shaded in FIGS. 4B and 4C. Compared with the prior art, the switching operation characteristic of a device according to some embodiments of the present invention may be enhanced, which will be described later in more detail. That is, in the repetitive switching mechanisms, there may be very low resistance variation in the low resistance state (the set state). Also, there is may be very low resistance variation in the high resistance state (the reset state). Thus, even after many switching events, the set resistance in the low resistance state and the reset resistance in the high resistance state may be maintained substantially constant.

In a resistive memory cell according to some embodiments of the present invention, the first electrode plug 111 and the second electrode 115 may be formed of material selected from the group consisting of iridium, platinum, ruthenium, polycrystalline silicon, tungsten (W), titanium nitride (TiN), titanium aluminum nitride (TiAlN), and a combination thereof.

A method of fabricating the resistive memory cell illustrated in FIGS. 4A to 4C will now be described. An insulating layer 109 is patterned to form a contact hole 112. A conductive material for a first electrode is deposited in the contact hole 112. Then, a planarization process, such as a chemical mechanical polishing (CMP) or an etch-back, is performed to form a first electrode plug 111 in the contact hole 112. A resistive memory element thin film 113, such as a metal oxide, is formed on the first electrode plug 111 and the insulating layer 109. A conductive material for a second electrode is formed on the resistive memory element thin film 113. The conductive material for the second electrode is patterned in a predetermined shape to form the second electrode 115. During the patterning process for the second electrode, the resistive memory element thin film 113 can also be patterned. In this case, the resistive memory element thin film 113 and the second electrode 115 may have substantially the same shape.

Figure 5A:
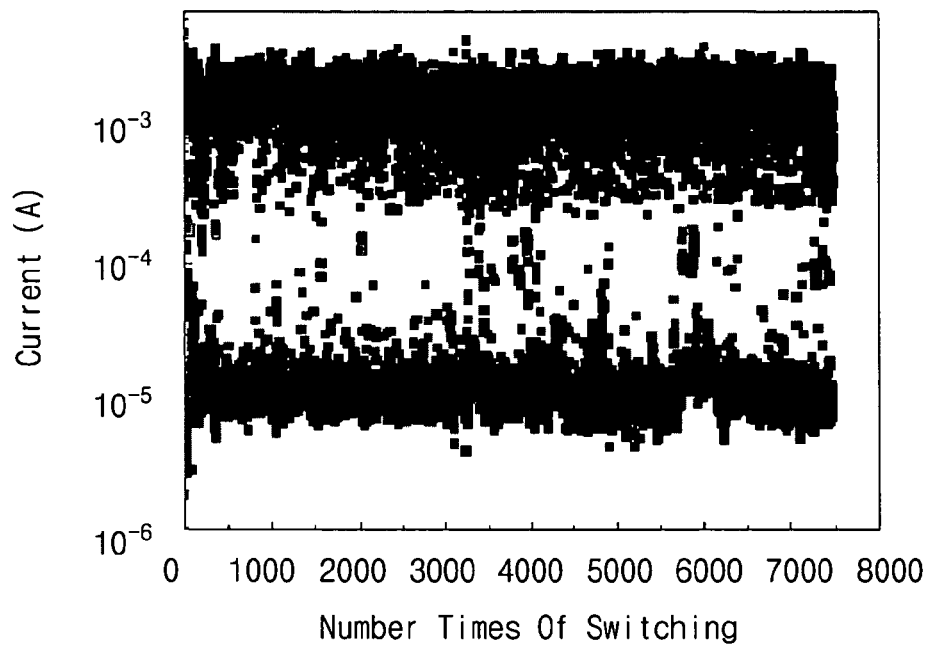
FIG. 5A is a graph of a current distribution with respect to two states in the conventional resistive memory cell illustrated in FIG. 1.
Figure 5B:
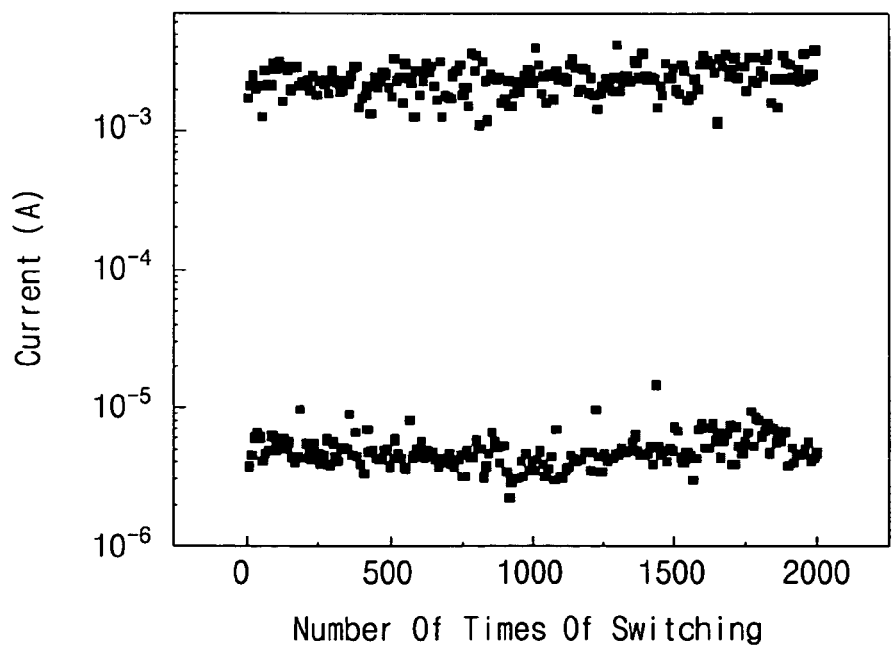
FIG. 5B is a graph of a current distribution with respect to two states in the resistive memory cell according to some embodiments of the present invention.

An improved resistance distribution characteristic can be seen from FIGS. 5A and 5B. FIG. 5A is a graph of a current distribution with respect to two states in the conventional resistive memory cell illustrated in FIG. 1, and FIG. 5B is a graph of a current distribution with respect to two states in a resistive memory cell according to some embodiments of the present invention. The resistance distribution can be determined from the current distribution and the applied voltage of FIGS. 5A and 5B. The resistance distribution exhibits similar characteristics to those of the current distribution.

For the conventional resistive memory cell configuration of FIG. 1, a resistive memory cell having a 1 μm×1 μm rectangular shape was fabricated. Two electrodes were formed of iridium and a resistive memory element thin film was formed of a nickel oxide ($NiO_2$) with a thickness of 200 angstroms.

For the resistive memory cell according to some embodiments of the present invention, a tungsten bottom electrode plug with a diameter of 0.15 μm was formed, and a resistive memory element thin film was formed of a nickel oxide ($NiO_2$) with a thickness of 200 angstroms. A top electrode with a diameter of 0.5 μm was formed of iridium, with a round shape.

For switching to the reset state, a reset voltage of 0.8 V was applied between the first electrode and the second electrode for 1 millisecond. For switching to the set state, a set voltage of 1.5 V was applied between the first electrode and the second electrode for 1 millisecond. A current limit of about 0.5 mA was maintained while the set voltage was applied. The current in the set state and the reset state was measured when a voltage of 0.2 V was applied between the two electrodes.

In FIGS. 5A and 5B, a horizontal axis represents the number of operations for the resistive memory cell and a vertical axis represents a current distribution measured in the set state and the reset state. In FIGS. 5A and 5B, an upper side represents the current distribution in the set state and a lower side represents the current distribution in the reset state.

As can be seen from FIGS. 5A and 5B, the resistive memory cell according to the present invention exhibits good switching operation characteristics compared with the conventional resistive memory cell. Also, it can be seen from FIG. 5A that the conventional resistive memory cell has a large current variation in the state and the reset state. Therefore, a sensing margin for discriminating the reset state and the set state may be very small.

However, it can be seen from FIG. 5B that the resistive memory cell according to some embodiments of the present invention has very low current variation in the reset state and the reset state. Therefore, a sensing margin for discriminating the reset state and the set state may be relatively large. According to some embodiments of the present invention, the reset state and the set state may be clearly discriminated, and a current difference between the two states may be very large. This discrimination may be maintained even after a large number of switching operations.

In addition, the overlapping area between the first electrode and the resistive memory element thin film is reduced and thus leakage current may be reduced. If the overlapping area is small, boundaries between grains of the resistive memory element thin film may be reduced and therefore leakage current via the grain boundaries may be reduced.

Further, by appropriately controlling a composition ratio of the resistive memory element thin film, the resistive memory cell may be driven at a low operating voltage or low operating current. The inventors have discovered that the set voltage and the reset voltage may be influenced by oxygen content of a resistive memory element thin film formed of a transition metal oxide.

For the low voltage or current driving, it is preferable that the oxygen composition ratio of the transition metal oxide be smaller than the oxygen composition ratio of the stable state. In other words, it is preferable that the transition metal oxide has a relatively large transition metal content compared with its stable state. In a transition metal oxide, expressed as $MO_x$, when the metal "M" is nickel (Ni), cobalt (Co), Zinc (Zn), or copper (Cu), "x," composition ratio of oxygen atoms, may have a range from 0.5 to 0.99 ($0.5 \leq x \leq 0.99$). When the metal "M" is hafnium (Hf), zirconium (Zr), titanium (Ti), or chromium (Cr), "x" may have a range from 1.0 to 1.98 ($1.0 \leq x \leq 1.98$). When the metal "M" is iron (Fe), "x" may have a range from 0.75 to 1.485. When the metal "M" is niobium (Nb), "x" may have a range from 1.25 to 2.475.

Using various methods, the transition metal oxide can be formed to have the above-described composition ratios of oxygen atoms. For example, the transition metal oxide can be formed by alternately and repeatedly performing an operation of forming a transition metal layer and an operation of oxidizing the transition metal layer using an oxygen plasma treatment. The transition metal layer can be formed using a sputtering technique. The oxygen plasma treatment can be performed in-situ. In some embodiments, the transition metal oxide layer can be formed using $O_2$ reactive sputtering technique, a chemical vapor deposition (CVD) technique, or an atomic layer deposition (ALD) technique.

FIGS. 6 to 9 are sectional views showing resistive memory cells according to further embodiments of the present invention, which may be viewed as modifications of the structure shown in FIGS. 4A-4C. The resistive memory cells of FIGS. 6 to 9 may have characteristics similar to those of the resistive memory cell described above with reference to FIGS. 4A-4C.

Figure 6:
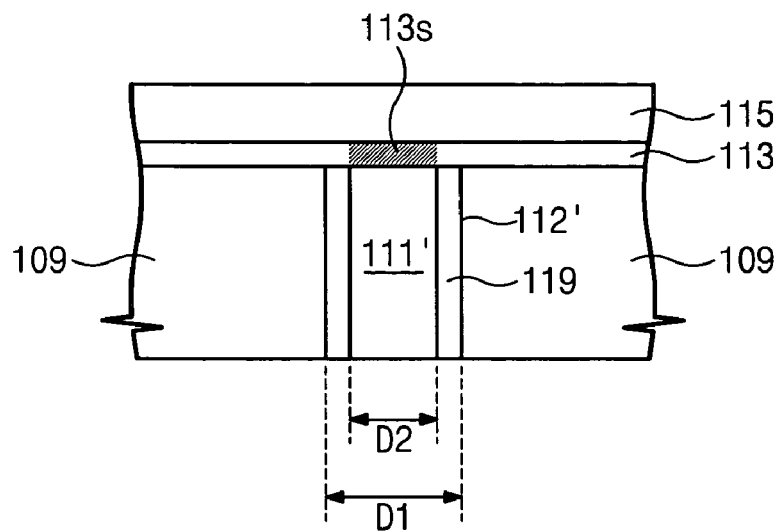
FIGS. 6 to 9 are sectional views taken along line I-I, showing various modifications of the resistive memory cells of FIGS. 4A-4C.

Referring to FIG. 6, insulating spacers 119 are formed on sidewalls of a contact hole 112. Accordingly, a diameter D2 of a first electrode plug 111 (and, accordingly, of a portion 113s of a resistive memory element thin film 113 contacting the plug 111) in the resistive memory cell of FIG. 6 may be smaller than the diameter D1 of the first electrode plug 111 in the resistive memory cell of FIG. 4B by two times the width of the insulating spacer 119. Accordingly, the switching operation characteristic of the resistive memory cell may be further improved. Prior to depositing a conductive material for the first electrode plug after forming the contact hole 112, the insulating spacers 119 of FIG. 6 can be formed by depositing an insulating material and performing an etch-back process on the insulating material. The insulating spacers 119 can be formed of, for example, silicon nitride.

Figure 7:
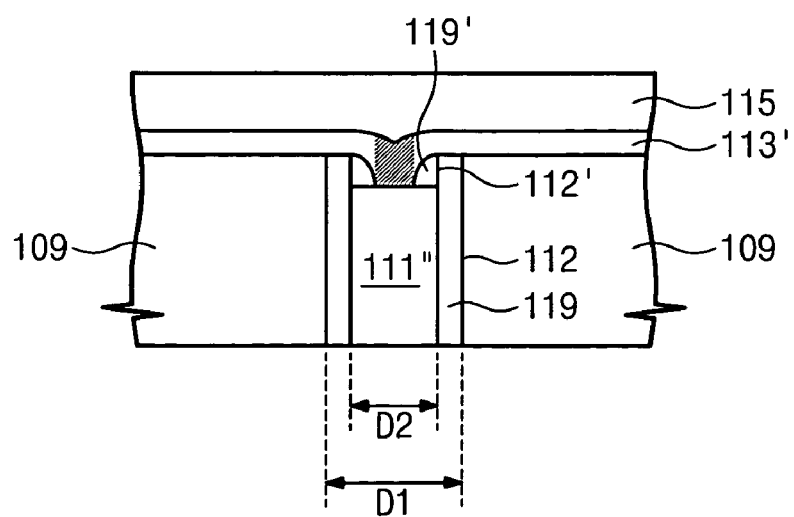
Figure 8:
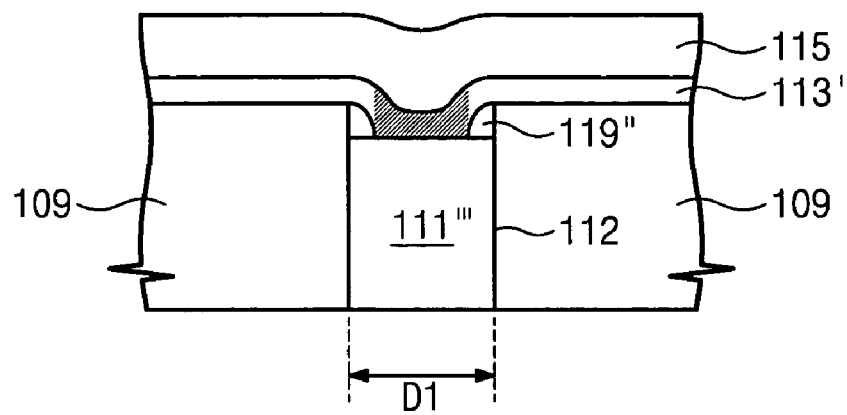
Figure 9:
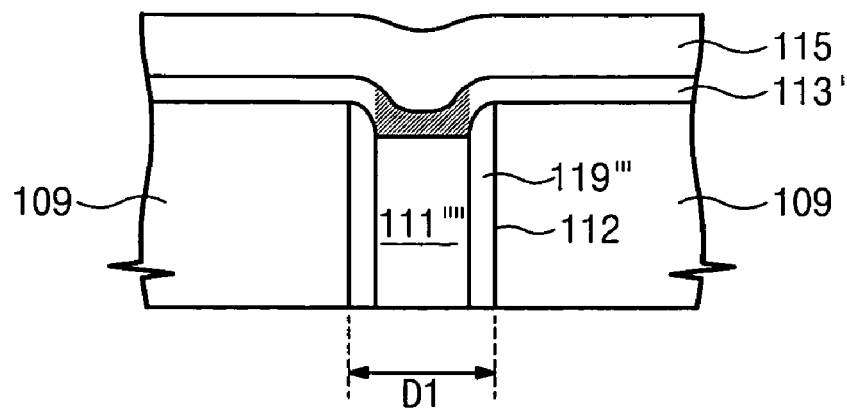

In further embodiments, a resistive memory element thin film 113' can extend into the contact hole as shown in FIGS. 7 to 9. For this, a contact hole 112 is partially filled with a first electrode plug 111'. The forming of the first electrode plug 111" recessed downward from the top of the insulating layer 109 may include forming a conductive layer for the first electrode and sequentially performing a planarization process and an etch-back process, or performing an etch-back process. A portion of the contact hole 112 is filled with the first electrode plug 111" and a portion of the contact hole 112 is filled with the resistive memory element thin film 113'.

The resistive memory cell of FIG. 7 includes two insulating spacers. One is a lower insulating spacer 119 formed on sidewalls of the contact hole 112, like the resistive memory cell illustrated in FIG. 6. The other is an upper insulating spacer 119' formed on sidewalls of a narrower contact hole 112' defined by the lower insulating spacer 119. Accordingly, the resistive memory cell of FIG. 7 may have a relatively smaller overlapping area between the first electrode 111' and the resistive memory element thin film 113' than the resistive memory cell of FIG. 6.

Further embodiments of the present invention include various modifications of the resistive memory cells described above. In FIG. 8, a resistive memory cell according to some embodiments uses a recessed first electrode plug 111''' and an upper insulating spacer 119" in a contact hole 112. In FIG. 9, a resistive memory cell according to further embodiments uses a recessed first electrode plug 111'''' and a lower insulating spacer 119'''.

A first electrode plug may be formed from multiple conductive layers. For example, after forming a recessed electrode plug as exemplarily illustrated in FIGS. 7-9, another electrode material may be deposited thereon. Then, a planarization process may be performed to form another electrode plug. If a conductive pattern to be connected to the recessed electrode plug is polycrystalline silicon doped with impurities of different conductivity type from the recessed electrode plug, a diode may be formed. A resistive memory pattern can be connected to the diode. Functions of such a diode will be described later. Resistive memory cells in which additional lower and upper insulating spacers are combined in the multi-layered electrode plug structure can be provided.

A Magneto-Resistive Memory Array

In some embodiments of the present invention, various kinds of unit resistive memory cells, such as those illustrated in FIGS. 4A-4C and 6-9, may be arranged in a resistive memory array. A resistive memory array according to some embodiments of the present invention may be a cross point memory array that does not require select transistors for access to respective resistive memory cells. A resistive memory array according to further embodiments of the present invention can include respective select transistors for access to respective resistive memory cells. Such a resistive memory array with the select transistors can be formed using a CMOS process.

A cross point memory array according to some embodiments of the present invention will now be described. When a second electrode (or a top electrode) of a resistive memory cell in the cross point memory array has a linear shape, the second electrode may serve as a word line. A first electrode (or a bottom electrode) may have a plug shape and a first electrode plug of the same column (or a row) may be connected to the same conductive line, which may act as a bit line. Conductive lines connecting the first electrode plugs can act as word lines and the line-shaped second electrodes can act as bit lines. As described above, because the resistive memory cell switches between two resistance states regardless of the polarities of the voltage applied between the two electrodes, which line serves as a word line and a bit line may depend on which electrode a relatively high voltage is applied to.

Figure 10A:
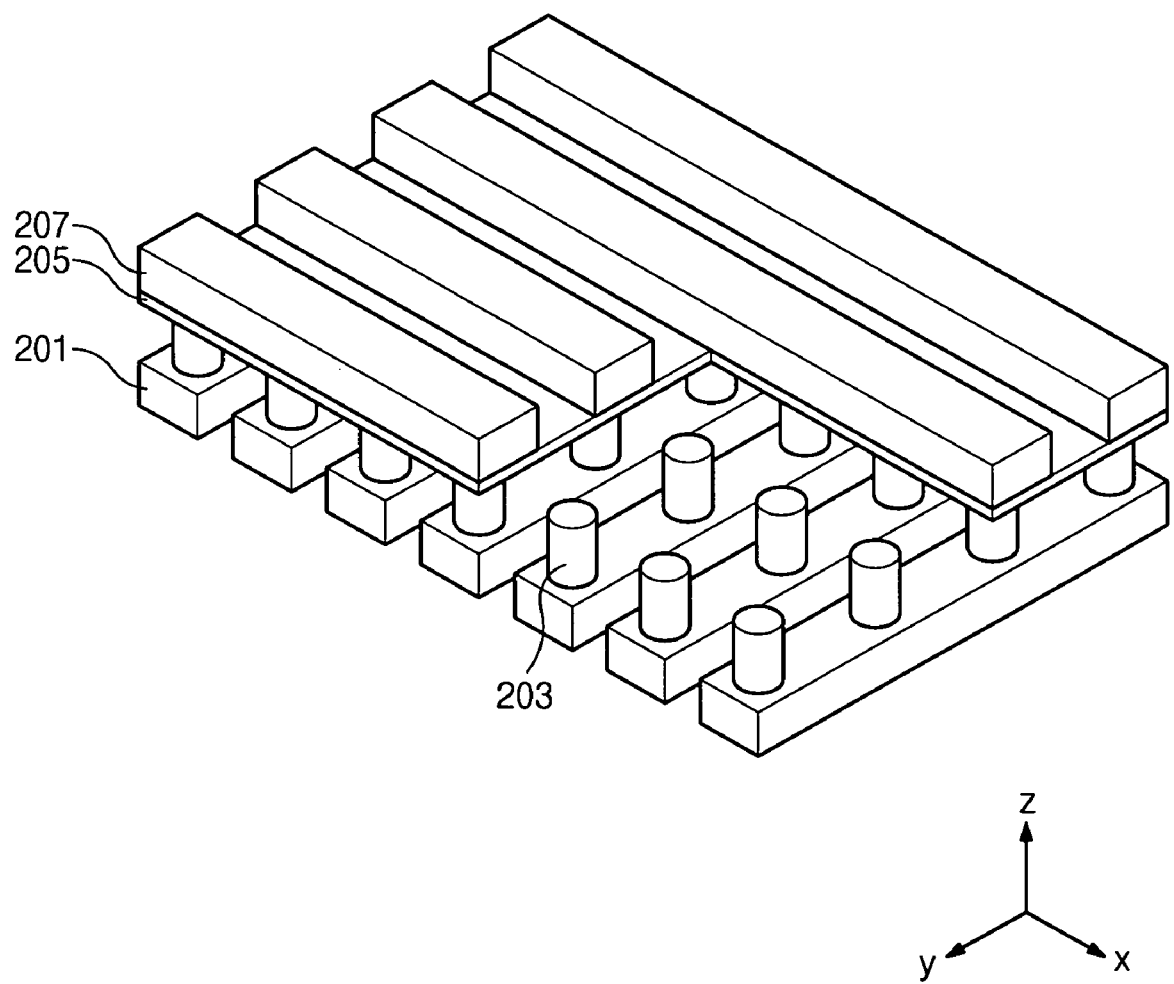
FIG. 10A is a perspective view of a resistive memory cell array according to some embodiments of the present invention.
Figure 10B:
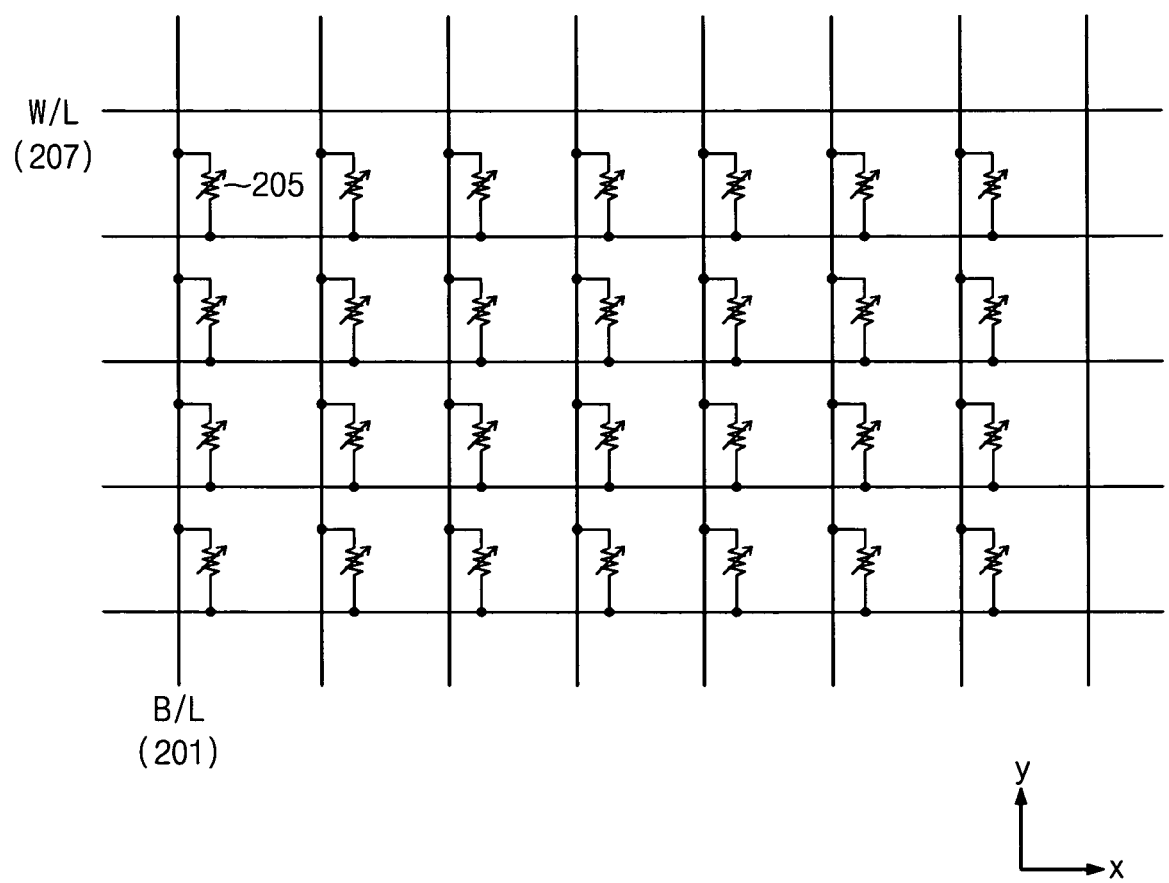
FIG. 10B is an equivalent circuit diagram of the resistive memory cell array illustrated in FIG. 10A.
Figure 10C:
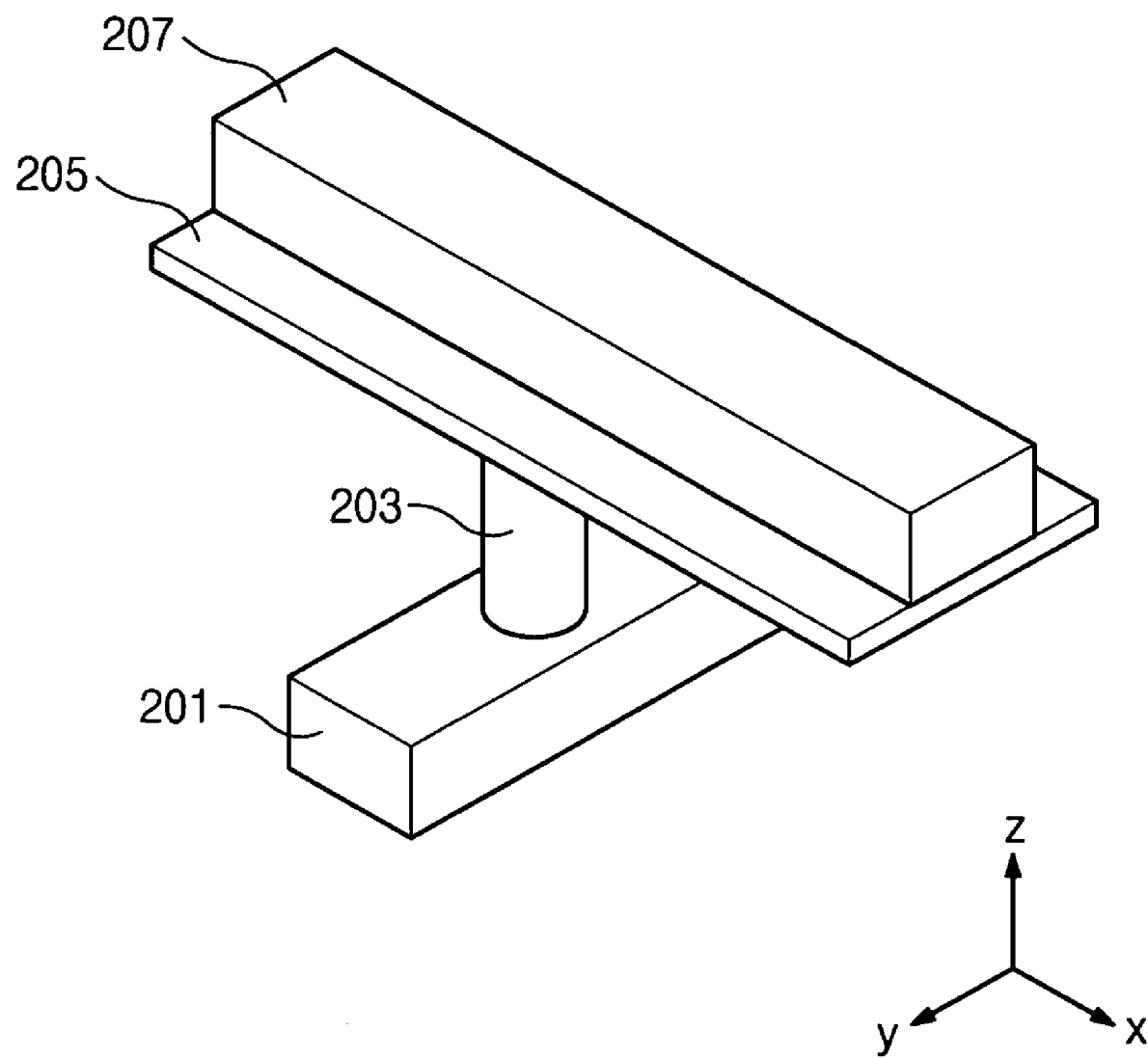
FIG. 10C is a perspective view of a resistive memory cell of the resistive memory cell array illustrated in FIG. 10A.

FIG. 10A is a perspective view of a resistive memory array according to some embodiments of the present invention. FIG. 10B is an equivalent circuit diagram of the resistive memory array illustrated in FIG. 10A. FIG. 10C is a perspective view of a resistive memory cell of the resistive memory array illustrated in FIG. 10A. A plurality of second electrodes (top electrodes) 207 is arranged in parallel in a row direction (x-axis). A plurality of conductive lines 201 is arranged in parallel in a column direction (y-axis). The second electrodes 207 and the conductive lines 201 intersect at a plurality of points. In some embodiments, the second electrodes 207 may be word lines and the conductive lines 201 may be bit lines. In other embodiments, the second electrodes 207 may be bit lines and the conductive lines 201 may be word lines.

A plurality of first electrodes (bottom electrodes) 203 are disposed at the intersecting points of the second electrodes 207 and the conductive lines 201. The first electrodes 203 in a given column are commonly connected to one of the conductive lines 201. A resistive memory element thin film 205 is disposed between the first electrodes 203 and the second electrodes 207. The resistive memory element thin film 205 can have various shapes. In the illustrated embodiments, the resistive memory element thin film 205 covers the memory cell array. In some embodiments, the resistive memory element thin film 205 may be broken into linear regions having, for example, substantially same shape as the second electrodes 207.

A diameter of the first electrode 203 is smaller than a width of the conductive line 201 and a width of the second electrode 207. A specific conductive line 201 and a specific second electrode 207 may be selected by a row/column decoder, such that the resistive memory cell at the corresponding intersecting point is selected. A sense amplifier is connected to the bit line and reads data stored in the selected resistive memory cell. Any of a number of different row/column decoding and sense amplifier operations known in the art may be used.

Figure 11A:
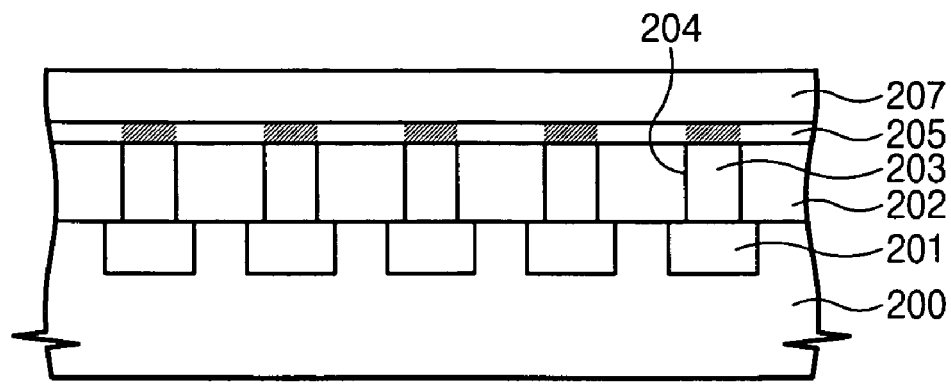
FIGS. 11A and 11B are sectional views of the resistive memory cell array of FIG. 10A, taken along a direction of a second electrode and a direction of a conductive line, respectively.
Figure 11B:
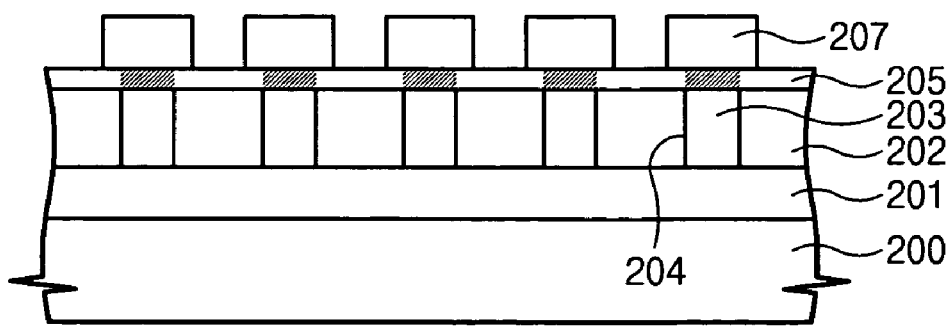

Operations for forming the conductive lines 201 will now be described with reference to FIGS. 11A and 11B. FIGS. 11A and 11B are sectional views of the resistive memory array illustrated in FIG. 10A, taken along the x-direction and the y-direction, respectively. Formation of the conductive lines 201 may include forming a conductive material (e.g., a polycrystalline silicon doped with impurities) on a substrate 200, and patterning the conductive material. A mask defining the outline of the conductive lines may be formed on the substrate 200, and used for ion implantation. An insulating layer 202 is formed and patterned to form contact holes 204 for formation of the first electrodes. A conductive material is deposited to fill the contact holes 204, and a planarization process is performed to form the first electrodes 203 within the contact holes 204. A transition metal oxide layer 205 is formed, and a conductive material layer is formed on metal oxide layer 205. The conductive material is patterned to form the second electrodes 207.

Figure 12:
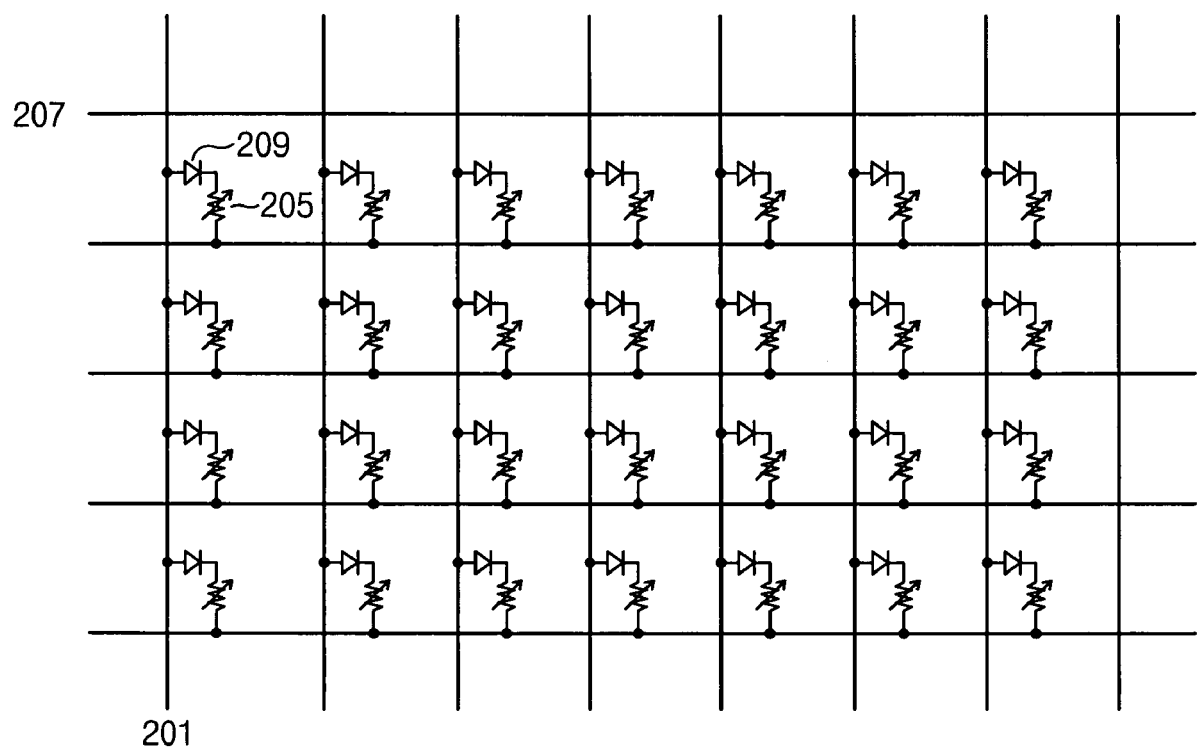
FIG. 12 is an equivalent circuit diagram of a resistive memory cell array including diodes according to further embodiments of the present invention.
Figure 12:
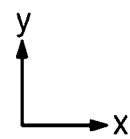

By selecting a particular conductive line 201 and a particular second electrode 207, a resistive memory cell disposed at the intersecting point of the particular conductive line 201 and the particular second electrode 207 is selected. In order to reduce leakage current directed toward resistive memory cells other than the selected resistive memory cell, the resistive memory array can further include diodes 209, as illustrated in FIG. 12. The diodes 209 are disposed between the first electrode 203 and the conductive line 201. The diodes 209 may be formed by forming the conductive lines 201 using doped polysilicon or polysilicon with implanted impurities, depositing an insulating layer, forming contact holes defining the first electrodes, and implanting impurities having a conductivity type opposite to the conductivity of the conductive lines 201. Schottky barrier type contacts may also be formed at interfaces between the conductive lines 201 and the first electrodes 203.

Figure 13:
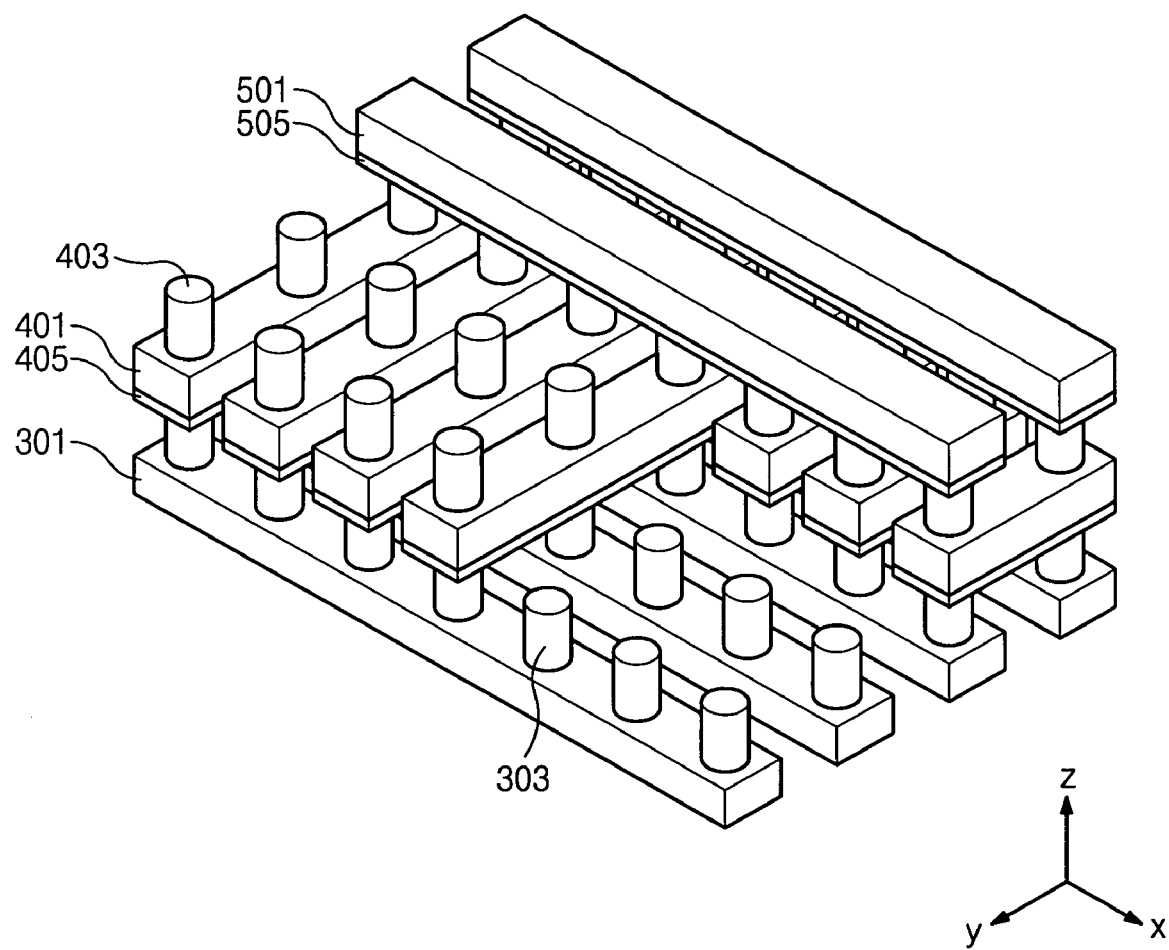
FIG. 13 is a perspective view of a multi-level resistive memory cell array according to additional embodiments of the present invention.

FIG. 13 is a partially cut-away perspective view of a multi-level resistive memory array according to additional embodiments of the present invention. Unlike the resistive memory array of FIG. 10, the resistive memory array of FIG. 13 includes unit memory cells arranged in vertical and horizontal planes. The resistive memory array of a certain level (along the z-axis) is identical to the resistive memory array described above with reference to FIG. 10. Vertically adjacent electrode lines are perpendicular to each other, and a plug-shaped electrode and a resistive memory element thin film are disposed at an intersection of the two vertically adjacent electrode lines. The plug-shaped electrode connects a conductive line of a lower level and a resistive memory element thin film disposed under an electrode line of an upper level.

In the multi-level resistive memory array according to such embodiments, the conductive lines of the lowermost level and the electrode lines of the uppermost level can act as word lines and bit lines under a first voltage condition. An electrode line disposed between the uppermost level and the lowermost level may act as a word line and bit line under a second voltage condition.

The multi-level resistive memory array will be described below in more detail with reference to FIG. 13. Referring to FIG. 13, 3-layered structure is illustrated. A conductive line 301 of the lowermost level corresponds to the conductive line 201 of FIG. 10A and extends in a row direction (x-direction). An electrode line 401 of a second level extends in a column direction (y-direction) and a resistive memory element thin film line 405 is disposed on the bottom surface of the electrode line 401. The electrode line 401 of the second level and the conductive line 301 of the first level are perpendicular to each other, and an electrode plug 303 is disposed at their intersection. An electrode line 501 of a third level extends in the row direction (x-direction) and is perpendicular to the electrode line 401 of the second line. An electrode plug 403 is disposed at the intersection of the electrode line 501 of the third level and the electrode line 401 of the second level. A resistive memory element thin film line 505 is disposed on the bottom surface of the electrode line 401 of the third level.

The electrode line 401 may be a word line, the electrode line 401 may be a bit line and the electrode line 501 may be word line. First ends of the electrode line and the conductive line may be formed on the substrate through a contact plug or the like so as to form a current path, and may be connected to a drain of a transistor having its source grounded. Second ends of the electrode line and the conductive line may be connected to a row/column decoder.

Figure 14:
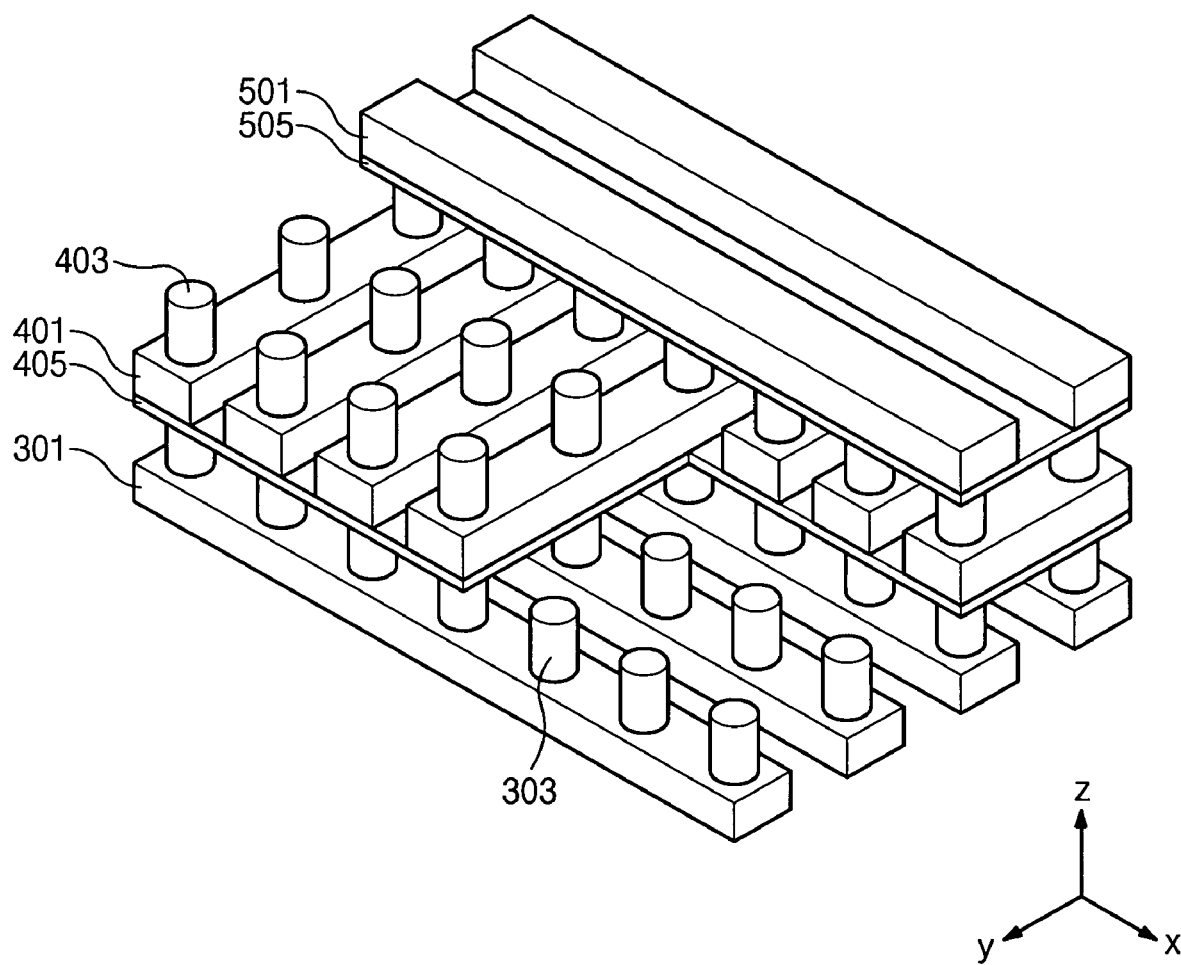
FIG. 14 is a perspective view of a multi-layer resistive memory cell array according to further embodiments of the present invention.

According to some embodiments of the present invention, a multi-level resistive memory array can array resistive memory cells vertically as well as horizontally. Therefore, more highly integrated memory devices may be implemented. In the illustrated embodiments, the resistive memory element takes the form of parallel lines having the same shape as the electrode lines. In some embodiments, the resistive memory element can also cover the resistive memory cell region, as illustrated in FIG. 14.

Figure 15A:
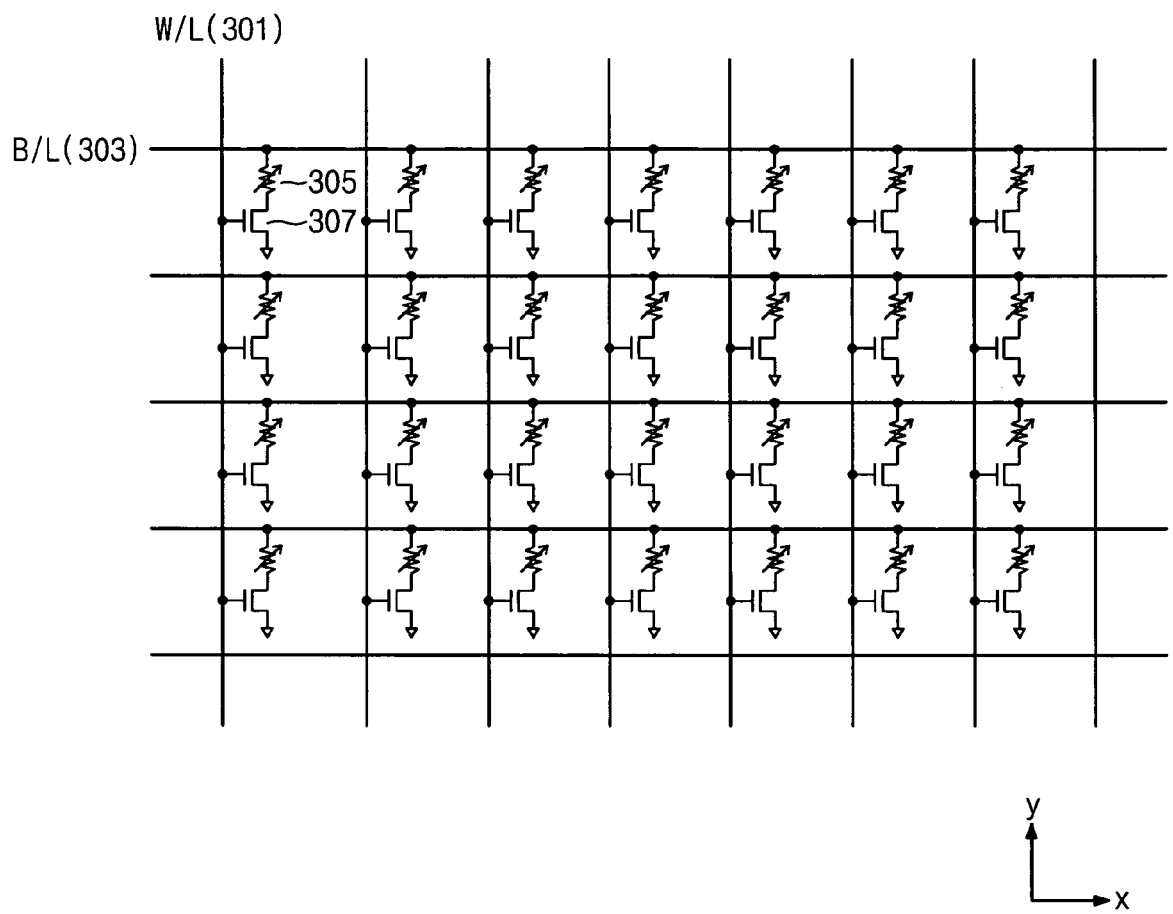
FIG. 15A is an equivalent circuit diagram of a resistive memory cell array according to yet further embodiments of the present invention.
Figure 15B:
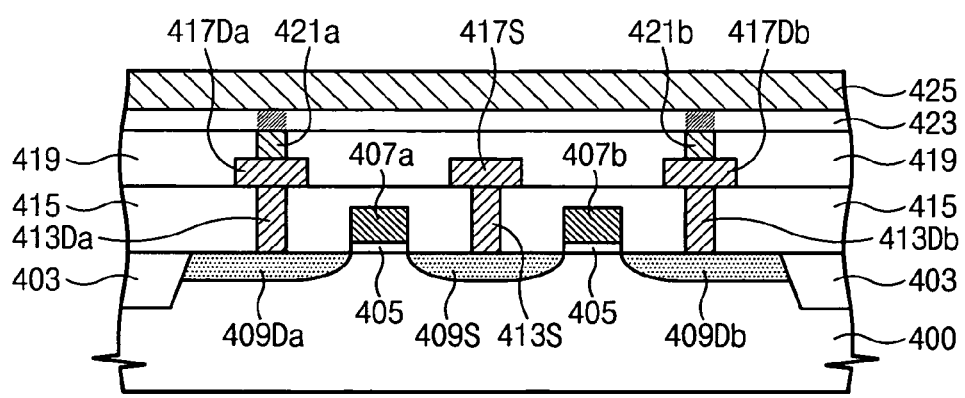
FIG. 15B is a sectional view of two resistive memory cells, taken along a direction perpendicular to a word line in the resistive memory cell array of FIG. 15A.

FIG. 15A is an equivalent circuit diagram of a resistive memory cell array with select transistors according to further embodiments of the present invention. FIG. 15B is a sectional view of two such resistive memory cells. Referring to FIG. 15A, one terminal (e.g., a bottom electrode) of each of the resistive memory cells 305 is connected to a drain of a select transistor 307, and the other terminal (e.g., a top electrode) is connected to a bit line 303. A gate of each of the select transistors is extended to form a word line 301. A source of the select transistor is connected to a ground voltage. When a bias voltage higher than a threshold voltage is applied to a gate of the select transistor 307 and an appropriate operating voltage is applied to the bit line 303, the resistive memory cell 305 is selected. Then, a read operation or a switching operation is performed on the selected resistive memory cell responsive to the voltage applied to the bit line 303.

Referring to FIG. 15B, a device isolation layer 403 is provided in a predetermined region of a semiconductor substrate 400, defining an active region. The device isolation region 403 can be formed by a well-known isolation process, such as a shallow trench isolation (STI) process. Spaced-apart first and second drain regions 409Da and 409Db are formed in the active region. A common source region 409S is formed between the first and second drain regions 409Da and 409Db. A first gate electrode 407a is disposed on the active region between the common source region 409S and the first drain region 409Da. A second gate electrode 407b is disposed on the active region between the common source region 409S and the second drain region 409Db. The first and second gate electrodes 407a and 407b extend perpendicular to the section plane and serve as first and second word lines, respectively. The first and second gate electrodes 407a and 409b are insulated from the active region by the gate insulating layer 405. The first gate 407a, the common source region 409S, and the first drain region 409Da form a first select transistor, and the second gate 407b, the common source region 409S, and the second drain region 409Db form a second select transistor.

These select transistors can be fabricated using known CMOS processes. The gate electrode can be formed by depositing and patterning a conductive material, and the source and drain regions can be formed by implanting impurity ions.

The select transistors and the device isolation layers 403 are covered with a first insulating layer 415. The first insulating layer 415 may be, for example, a silicon oxide layer, a silicon nitride layer, or a combination layer thereof. The common source region 409S is electrically connected through the source contact plug 413S to the common source line 417S formed on the first insulating layer 415. The common source line 417S can be disposed parallel to the gates 407a and 407b. The first drain region 409Da is electrically connected to the first drain contact 417Da through a first drain contact plug 413Da penetrating the first insulating layer 415. The second drain region 409Db is electrically connected to the second drain contact 417Db through a second drain contact plug 413Db penetrating the first insulating layer 415. The common source line 417S, the drain contacts 417Da and 417Db, and the contact plugs 413S, 413Da and 413Db can be formed by patterning an insulating layer, depositing a conductive layer, and patterning the deposited conductive layer.

A second insulating layer 419 is disposed on the first insulating layer 415. The second insulating layer may be, for example, a silicon oxide layer, a silicon nitride layer, or a combination layer thereof. A first bottom electrode plug 421a penetrates the second insulating layer 419 and is electrically connected to the first drain contact 417Da. A second bottom electrode plug 421b is electrically connected to the second drain contact 417Db. The resistive memory element pattern 423 covers the second insulating layer 419 and the first and second bottom electrode plugs 421a and 421b. A top electrode line 425 perpendicular to the gates 407a and 407b is disposed on the resistive memory element pattern 423. A resistive memory cell is formed at the intersection of the first bottom electrode plug 421a and the top electrode line 425. Likewise, a resistive memory cell is formed at the intersection of the second bottom electrode plug 421b and the top electrode line 425. The bottom electrode plug, the resistive memory element pattern, and the top electrode line can be formed using the above-described methods.

Figure 16:
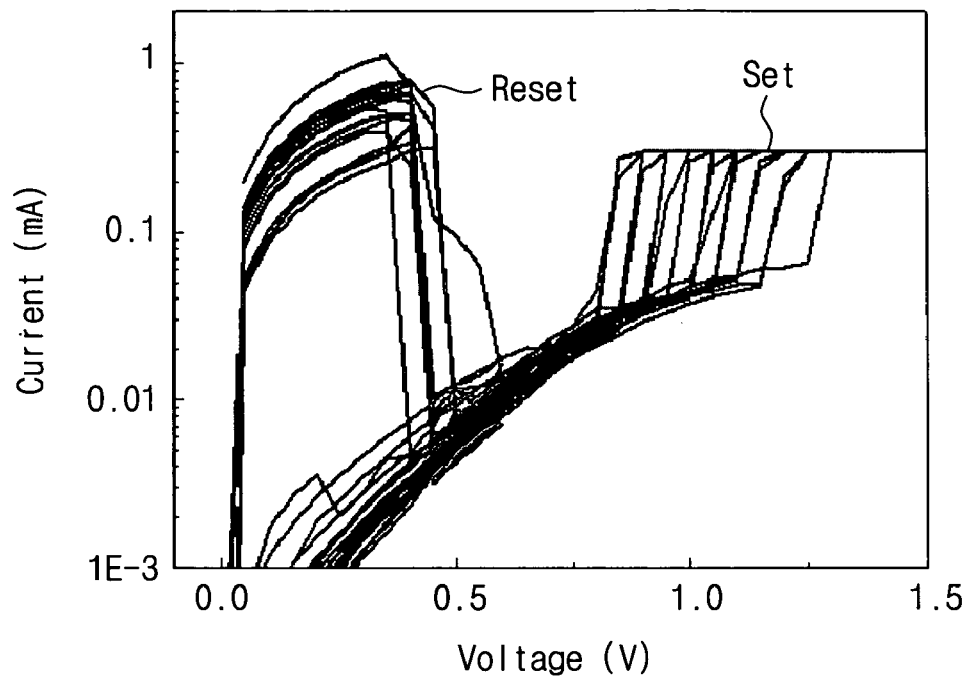
FIG. 16 is a current-voltage curve illustrating a switching characteristic in a resistive memory cell according to additional embodiments of the present invention.

FIG. 16 illustrates an I-V curve of a switching mechanism of the resistive memory cell according to some embodiment of the present invention. In FIG. 16, a horizontal axis represents a voltage (V) applied for the set and reset operations, and a vertical axis represents a current (mA) with respect to the applied voltage. Referring to FIG. 16, it can be seen that a resistive memory cell structure according to some embodiments of the present invention exhibits a low set current and low reset current of less than 1 mA. As described above, it can be actually confirmed that the set current is lower than the reset current.

Figure 17:
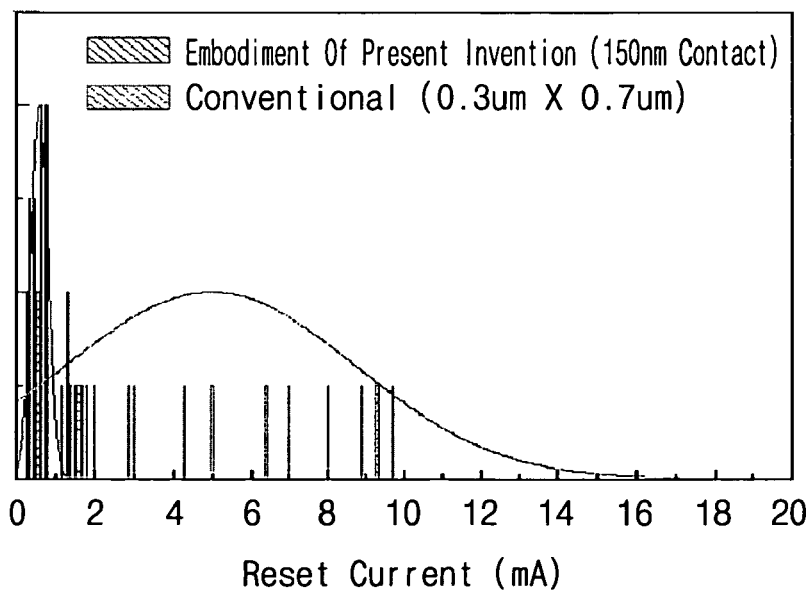
FIG. 17 is a graph of a reset current in the conventional memory cell of FIG. 1 and in resistive memory cells according to some embodiments of the present invention.

It can be seen from FIG. 17 that a resistive memory cell structure according to some embodiments of the present invention may exhibit a lower operating current than a conventional resistive memory cell structure. FIG. 17 is a graph illustrating a distribution of a reset current (mA) in the conventional memory cell of FIG. 1 and the resistive memory cells according to an embodiment of the present invention. In this measurement, for the resistive memory of the present invention, a tungsten bottom electrode with a diameter of 0.15 µm was formed, and an iridium top electrode with a diameter of 0.5 µm was formed. A resistive memory cell having the structure illustrated in FIG. 1 and having a 0.3 µm×0.7 µm rectangular shape was formed. The resistive memory element thin film thereof was formed of a nickel oxide with a thickness of 200 angstroms. Referring to FIG. 17, it can be seen that a resistive memory cell according to some embodiments of the present invention may have a significantly lower reset current than such a conventional resistive memory cell.

According to some embodiments of the present invention, one of the two electrodes in the resistive memory cell has a plug shape. Accordingly, the switching region thereof may be restricted by the overlapped area between the resistive memory element thin film and the electrode plug. In such device, even after repeated switching operations, there may be little or no variation in the resistance distributions of the set state and the reset state, which may improve the resistive dispersion characteristic and sensing margin. Consequently, reliable and robust memory devices may be obtained. In addition, the overlapping area between the electrode and the resistive memory element thin film may be reduced and leakage current through the grain boundary of the resistive memory element thin film may be reduced. Furthermore, operating current may be reduced and stabilized.

Because the electrode material used for the resistive memory cell may be difficult to etch, its sidewalls may be inclined after etching. Accordingly, there is a strong possibility of electrical short between the adjacent electrodes. If the electrodes are spaced far away from each other so as to prevent the electrical short therebetween, high integration required by the memory devices cannot be achieved. However, according to the present invention, one of the two electrodes has a plug shape and, therefore, dry etching of the plug shaped contact may be avoided. Therefore, the risk of forming an electrical short between adjacent electrodes may be reduced, which may allow reduction of the distance between the adjacent top electrodes compared with conventional devices. According to further aspects of the present invention, resistive memory cells can be arrayed vertically and horizontally, allowing the formation of highly integrated memory devices.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims.

What is claimed is:

1. A memory device comprising:
a plurality of first electrode lines arranged in parallel on a substrate;
a plurality of second electrode lines arranged in parallel on the substrate transverse to the first electrode lines;
a plurality of electrode plugs electrically coupled to the first electrode lines, respective ones of the electrode plugs disposed between ones of the first and second electrode lines at respective intersections thereof; and
a resistive thin film material region, the resistive thin film material region having a first surface directly in contact with at least one of the electrode plugs and a second surface directly in contact with at least one of the second electrode lines,
wherein the second surface has a greater area than the first surface and wherein a width of the resistive thin film material region is equal to or greater than a width of the at least one of the second electrode lines, and wherein the first electrode lines and the second electrode lines serve as word lines and bit lines, respectively, or wherein the first electrode lines and the second electrode lines serve as bit lines and word lines, respectively.

2. The memory device of claim 1, wherein the resistive thin film material region comprises a colossal magneto-resistive material.

3. The memory device of claim 1, wherein the resistive thin film material region comprises an insulating material with a perovskite phase and/or a transition metal oxide.

4. The memory device of claim 1, wherein an area of overlap between the at least one of the electrode plugs and the resistive thin film material region is smaller than an area of overlap between the resistive thin film material region and the at least one of the second electrode lines.

5. The memory device of claim 1, wherein a width of the resistive thin film material region is greater than a width of the at least one of the second electrode lines contacting the resistive thin film material region.

6. The memory device of claim 1, wherein the resistive thin film material region comprises an array of individual patterns disposed between ones of the first and second electrode lines at respective intersections thereof.

7. The memory device of claim 1, wherein the resistive thin film material region comprises a plurality of regions in a resistive thin-film material layer that overlaps multiple ones of the electrode plugs.

8. A memory device comprising:
a plurality of first conductive lines arranged in parallel on a substrate;
a plurality of second conductive lines arranged in parallel on the substrate transverse to the first conductive lines;
a plurality of electrode plugs electrically coupled to the first conductive lines, respective ones of the electrode plugs disposed between ones of the first and second conductive lines at respective intersections thereof; and
a resistive material layer between one of the electrode plugs and one of the second conductive lines and directly in contact with each of the one of the electrode plugs and the one of the second conductive lines, wherein the resistive material layer and the one of the second conductive lines cover the one of the electrode plugs and extend outwardly from the one of the electrode plugs and wherein a width of the resistive material layer is equal to or greater than a width of the one of the second conductive lines, and wherein the first conductive lines and the second conductive lines serve as word lines and bit lines, respectively, or wherein the first conductive lines and the second conductive lines serve as bit lines and word lines, respectively.

9. The memory device of claim 8, wherein the resistive material layer comprises a colossal magneto-resistive material.

10. The memory device of claim 8, wherein the resistive material layer comprises an insulating material with a perovskite phase and/or a transition metal oxide.

11. The memory device of claim 8, wherein the resistive material layer comprises an array of individual patterns disposed between ones of the first and second conductive lines at respective intersections thereof.

12. The memory device of claim 8, wherein the resistive material layer overlaps multiple ones of the electrode plugs and multiple ones of the second conductive lines.

* * * * *